US012666829B2

(12) United States Patent
Xie et al.

(10) Patent No.: US 12,666,829 B2
(45) Date of Patent: Jun. 23, 2026

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Taofeng Xie, Beijing (CN); Yuanjie Xu, Beijing (CN); Shuang Li, Beijing (CN); Yao Huang, Beijing (CN); Yue Long, Beijing (CN); Jianchang Cai, Beijing (CN); Binyan Wang, Beijing (CN); Jing Zhang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 406 days.

(21) Appl. No.: 18/255,277

(22) PCT Filed: Apr. 27, 2022

(86) PCT No.: PCT/CN2022/089651
§ 371 (c)(1),
(2) Date: May 31, 2023

(87) PCT Pub. No.: WO2023/206164
PCT Pub. Date: Nov. 2, 2023

(65) Prior Publication Data
US 2024/0357881 A1     Oct. 24, 2024

(51) Int. Cl.
*H10K 59/131* (2023.01)
*H10K 59/65* (2023.01)

(52) U.S. Cl.
CPC ........... *H10K 59/131* (2023.02); *H10K 59/65* (2023.02)

(58) Field of Classification Search
CPC ....... H10K 59/131; H10K 59/65; H10D 86/00
See application file for complete search history.

(56) References Cited

U.S. PATENT DOCUMENTS 12,108,647 B2 * 10/2024 Long .................... H10K 59/121
12,328,993 B2 * 6/2025 Xu ........................ H10K 59/124
(Continued)

FOREIGN PATENT DOCUMENTS

CN      110874990 A      3/2020
CN      111554693 A      8/2020
(Continued)

*Primary Examiner* — Thao P Le
(74) *Attorney, Agent, or Firm* — XSENSUS LLP

(57)         ABSTRACT

A display substrate has a primary display region and a secondary display region, and the secondary display region includes an element arrangement region and a transition region. The display substrate includes: a substrate, and a pixel circuit layer and first via holes located on the substrate. The pixel circuit layer includes an active layer and a multi-layer inorganic insulating layer disposed on a side of the active layer away from the substrate. The active layer is located at least in the primary display region and at least partially surrounds the secondary display region. The multi-layer inorganic insulating layer is located at least in the primary display region and the secondary display region. The first via holes are located at least in the transition region, and penetrate at least one layer of the multi-layer inorganic insulating layer.

20 Claims, 19 Drawing Sheets

(56)                    References Cited

U.S. PATENT DOCUMENTS

| | | | |
|---|---|---|---|
| 2014/0367669 A1* | 12/2014 | Takeuchi ............. | H10K 59/122 |
| | | | 438/34 |
| 2017/0077188 A1 | 3/2017 | Kang et al. | |
| 2022/0123094 A1* | 4/2022 | Qiu ....................... | H10K 59/121 |
| 2022/0359632 A1 | 11/2022 | Yang et al. | |
| 2023/0045264 A1* | 2/2023 | Wang ................... | H10K 59/131 |
| 2023/0209925 A1* | 6/2023 | Fan ...................... | H10K 77/111 |
| | | | 257/40 |
| 2024/0049525 A1* | 2/2024 | Zhang ................... | H10K 59/87 |
| 2024/0357881 A1* | 10/2024 | Xie ......................... | H10D 86/00 |
| 2025/0160145 A1* | 5/2025 | Yi .......................... | H10K 71/00 |
| 2025/0324887 A1* | 10/2025 | Zeng ................... | H10K 59/871 |
| 2025/0386690 A1* | 12/2025 | Zeng ................... | H10K 59/131 |

FOREIGN PATENT DOCUMENTS

| | | |
|---|---|---|
| CN | 211929490 U | 11/2020 |
| CN | 113314577 A | 8/2021 |
| CN | 114094030 A | 2/2022 |

* cited by examiner

1000

1000

100

C(C1/C12)                                        S

41

31(31a)

C(C1/
C11)

C(C2)                                    A2          31(31b)

21

23

26

22(223)

24

DISPLAY SUBSTRATE AND DISPLAY DEVICE

CROSS-REFERENCE TO RELATED APPLICATION

This application is a national phase entry under 35 USC 371 of International Patent Application No. PCT/CN2022/089651, filed on Apr. 27, 2022, which is incorporated herein by reference in its entirety.

TECHNICAL FIELD

The present disclosure relates to the field of display technologies, and in particular, to a display substrate and a display device.

BACKGROUND

With the continuous development of science and technology, users have higher and higher pursuit of the screen-to-body ratio of the display device (the ratio of the area of the display screen to the area of the front panel of the display device).

In the field of display technologies, the concept of full screen has emerged, that is, optical devices such as cameras in the display device are arranged below the display screen, so as to increase the ratio of the area of the display screen to the area of the front panel of the display device, and make the ratio close to 100%.

SUMMARY

In an aspect, a display substrate is provided. The display substrate has a primary display region and a secondary display region. The primary display region at least partially surrounds the secondary display region, and the secondary display region includes an element arrangement region and a transition region surrounding the element arrangement region. The display substrate includes: a substrate, and a pixel circuit layer and a plurality of first via holes located on a side of the substrate. The substrate is located at least in the primary display region and the secondary display region. The pixel circuit layer includes an active layer and a multi-layer inorganic insulating layer disposed on a side of the active layer away from the substrate. The active layer is located at least in the primary display region, and at least partially surrounds the secondary display region. The multi-layer inorganic insulating layer is located at least in the primary display region and the secondary display region. The plurality of first via holes are located at least in the transition region, and the plurality of first via holes penetrate at least one layer of the multi-layer inorganic insulating layer.

In some embodiments, the secondary display region includes first unit area regions and second unit area regions, and a distance between a first unit area region of the first unit area regions and a border of the secondary display region is greater than a distance between a second unit area region of the second unit area regions and the border of the secondary display region. A distribution density of first via holes located in the first unit area region is less than or equal to a distribution density of first via holes located in the second unit area region.

In some embodiments, distribution densities of first via holes in at least two first unit area regions that are at a same distance from the border of the secondary display region are the same; and/or, distribution densities of first via holes in at least two second unit area regions at a same distance from the border of the secondary display region are the same.

In some embodiments, first via holes located in the secondary display region are evenly distributed.

In some embodiments, the plurality of first via holes are located in the transition region. At least some of the plurality of first via holes are arranged in sequence along a border of the element arrangement region and arranged in a ring.

In some embodiments, the pixel circuit layer includes a plurality of pixel circuits; a part of the plurality of first via holes are located in the transition region, and another part of the plurality of first via holes are located in at least a portion of the element arrangement region proximate to the transition region; and a minimum size of a region occupied by a part of first via holes, located in the element arrangement region, of the plurality of first via holes is greater than or equal to a size of a pixel circuit.

In some embodiments, a distribution density of a part of first via holes, located in the transition region, of the plurality of first via holes is the same as a distribution density of the part of first via holes, located in the element arrangement region, of the plurality of first via holes.

In some embodiments, the display substrate further includes a light-emitting device layer located on a side of the pixel circuit layer away from the substrate. The light-emitting device layer includes a plurality of secondary light-emitting devices located in the secondary display region. Orthogonal projections of the part of first via holes, located in the element arrangement region, of the plurality of first via holes on the substrate do not overlap with orthographic projections of the plurality of secondary light-emitting devices on the substrate.

In some embodiments, a distribution density of the plurality of first via holes is in a range from 1% to 14%.

In some embodiments, in a direction of a line passing through a center of the element arrangement region and connecting to a border of the secondary display region, a diameter of a first via hole is negatively correlated with a distance between the first via hole and the border of the secondary display region.

In some embodiments, the multi-layer inorganic insulating layer includes a first gate insulating layer, a second gate insulating layer and an interlayer dielectric layer that are stacked in sequence in a direction away from the active layer; and at least one of the plurality of first via holes penetrates the interlayer dielectric layer, the second gate insulating layer and the first gate insulating layer.

In some embodiments, the pixel circuit layer further includes a plurality of redundant semiconductor patterns located in the secondary display region, and the plurality of redundant semiconductor patterns are arranged in the same layer as the active layer. The display substrate further comprises a plurality of second via holes located in the secondary display region, and the second via holes penetrate at least one layer of the multi-layer inorganic insulating layer. Orthogonal projections of the second via holes on the substrate are located within orthogonal projections of the plurality of redundant semiconductor patterns on the substrate; and at least one of the second via holes in the transition region is a first via hole.

In some embodiments, the plurality of second via holes penetrate the interlayer dielectric layer, the second gate insulating layer and the first gate insulating layer to surfaces of the plurality of redundant semiconductor patterns away from the substrate.

In some embodiments, the display substrate further includes a light-emitting device layer disposed on a side of the pixel circuit layer away from the substrate; the light-emitting device layer includes a plurality of secondary light-emitting devices located in the secondary display region; and orthogonal projections of at least some of the plurality of second via holes on the substrate are located within orthographic projections of the plurality of secondary light-emitting devices on the substrate.

In some embodiments, a part of the plurality of second via holes are located in the element arrangement region. A distribution density of part of the plurality of first via holes proximate to a border of the element arrangement region is greater than or equal to a distribution density of second via holes located in the element arrangement region.

In some embodiments, the display substrate further includes a plurality of third via holes located at least in the primary display region; the plurality of third via holes penetrate the multi-layer inorganic insulating layer to a surface of the active layer away from the substrate; and a distribution density of the plurality of third via holes is less than or equal to a distribution density of the plurality of first via holes.

In some embodiments, the pixel circuit layer includes a plurality of pixel circuits, at least some of the plurality of pixel circuits are located in the primary display region, and the at least some of the plurality of pixel circuits located in the primary display region surround the secondary display region. The pixel circuits each include a driving transistor, and minimum distances, to the secondary display region, of driving transistors closest to a border of the secondary display region are the same.

In some embodiments, the display substrate further includes a light-emitting device layer located on a side of the pixel circuit layer away from the substrate, and the light-emitting device layer includes a plurality of primary light-emitting devices in the primary display region and a plurality of secondary light-emitting devices located in the secondary display region. The pixel circuit layer includes a plurality of display pixel circuits, and the plurality of display pixel circuits includes a plurality of first display pixel circuits and a plurality of second display pixel circuits. The plurality of first display pixel circuits are located in the primary display region, and are respectively electrically connected to the plurality of primary light-emitting devices. The plurality of second display pixel circuits are located in the primary display region, and are respectively electrically connected to the plurality of secondary light-emitting devices through conductive lines.

In some embodiments, the display substrate has a display region and a bezel region surrounding the display region, and the display region includes the primary display region and the secondary display region. The display substrate further includes a light-in emitting device layer located on the pixel circuit layer, and the light-emitting device layer includes a plurality of primary light-emitting devices located in the primary display region and a plurality of secondary light-emitting devices located in the secondary display region. The pixel circuit layer includes a plurality of display pixel circuits; the plurality of display pixel circuits includes a plurality of first display pixel circuits and a plurality of second display pixel circuits; the plurality of first display pixel circuits are located in the primary display region, and are respectively electrically connected to the plurality of primary light-emitting devices; and the plurality of second display pixel circuits are located in the bezel region, and are respectively electrically connected to the plurality of secondary light-emitting devices through conductive lines.

In some embodiments, the pixel circuit layer further includes a plurality of redundant pixel circuits. The plurality of redundant pixel circuits are located in the primary display region, and are located between the plurality of display pixel circuits and the secondary display region.

In another aspect, a display device is provided. The display device includes the display substrate as described in any of the above embodiments, and an optical element. The optical element is disposed on a non-light exit side of the display substrate, and an orthographic projection of the optical element on the display substrate at least partially overlaps with the element arrangement region of the display substrate.

BRIEF DESCRIPTION OF THE DRAWINGS

In order to describe technical solutions in the present disclosure more clearly, the accompanying drawings to be used in some embodiments of the present disclosure will be introduced briefly. However, the accompanying drawings to be described below are merely some embodiments of the present disclosure, and a person of ordinary skill in the art can obtain other drawings according to those drawings. In addition, the accompanying drawings to be described below may be regarded as schematic diagrams, and are not limitations on actual sizes of products involved in the embodiments of the present disclosure.

5
6

Figure 13:
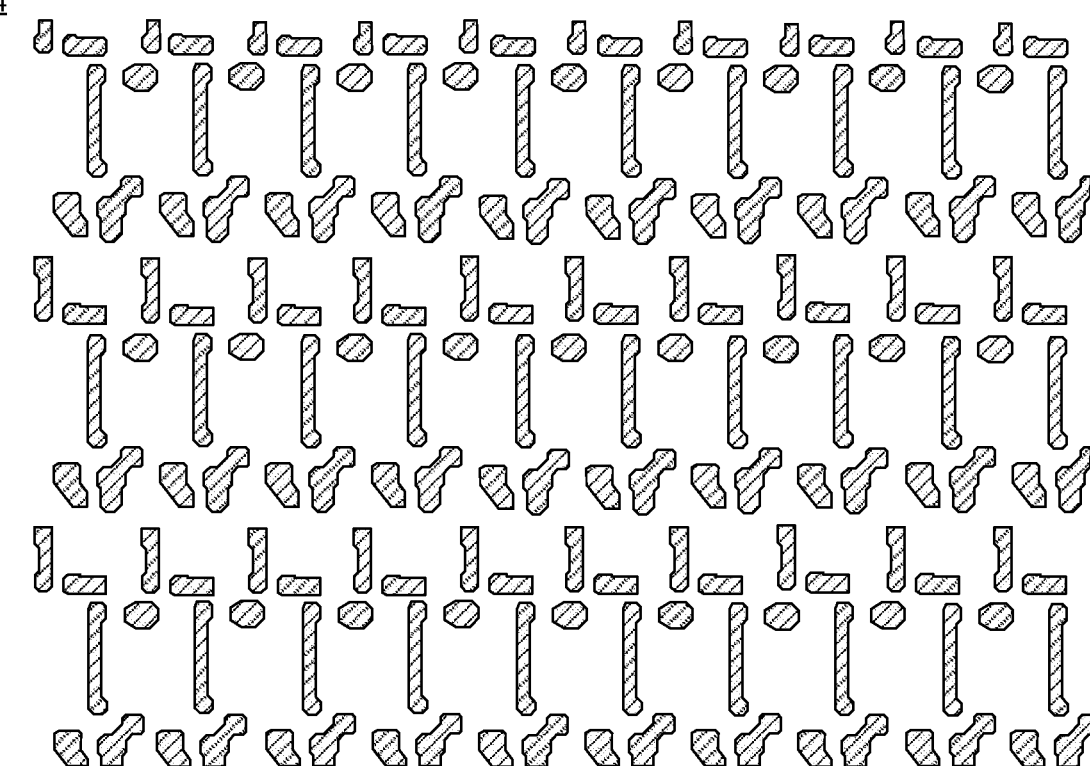
Figure 14:
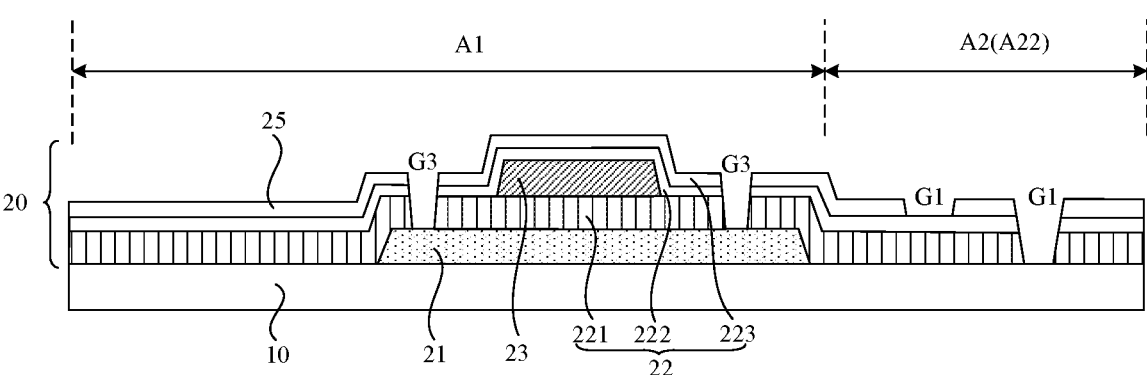
Figure 15:
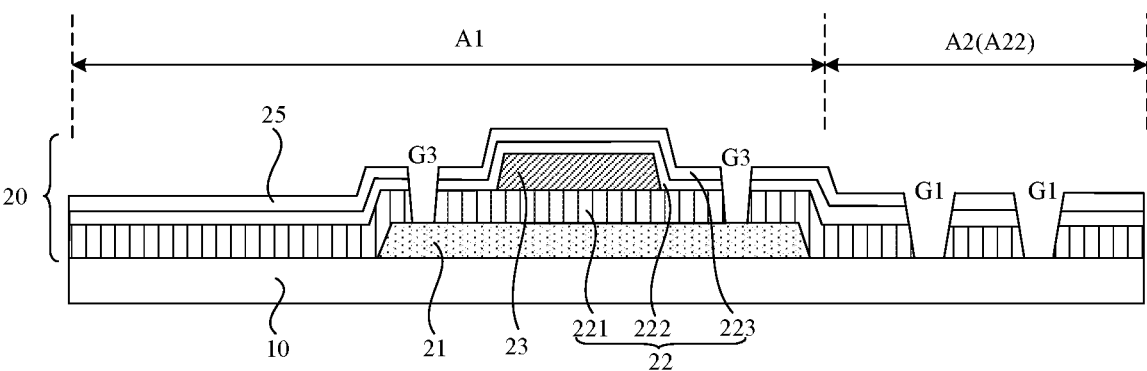
Figure 16:
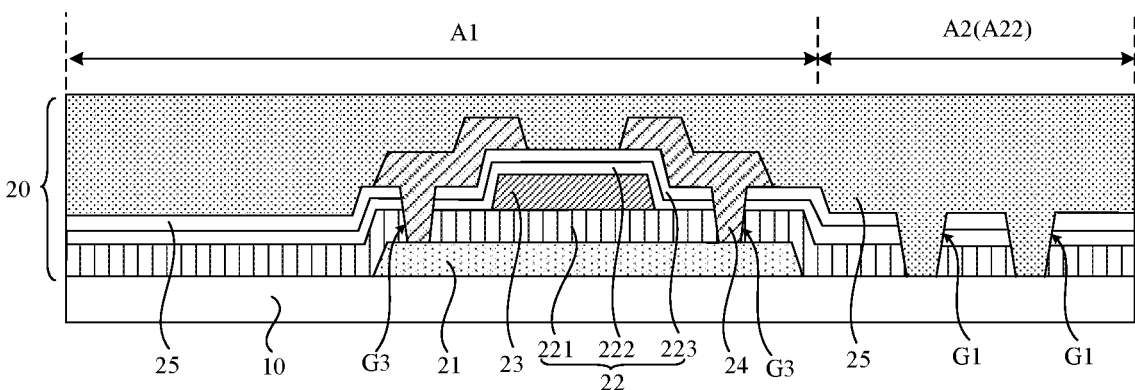
Figure 17:
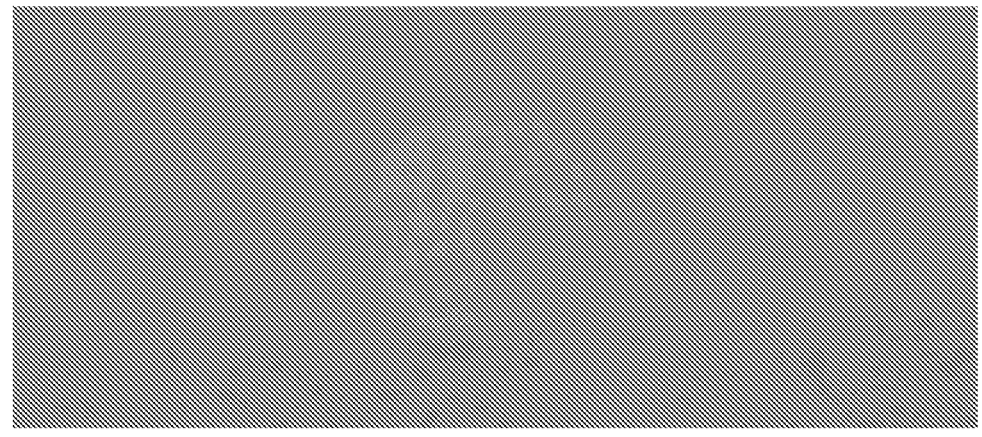
Figure 18:
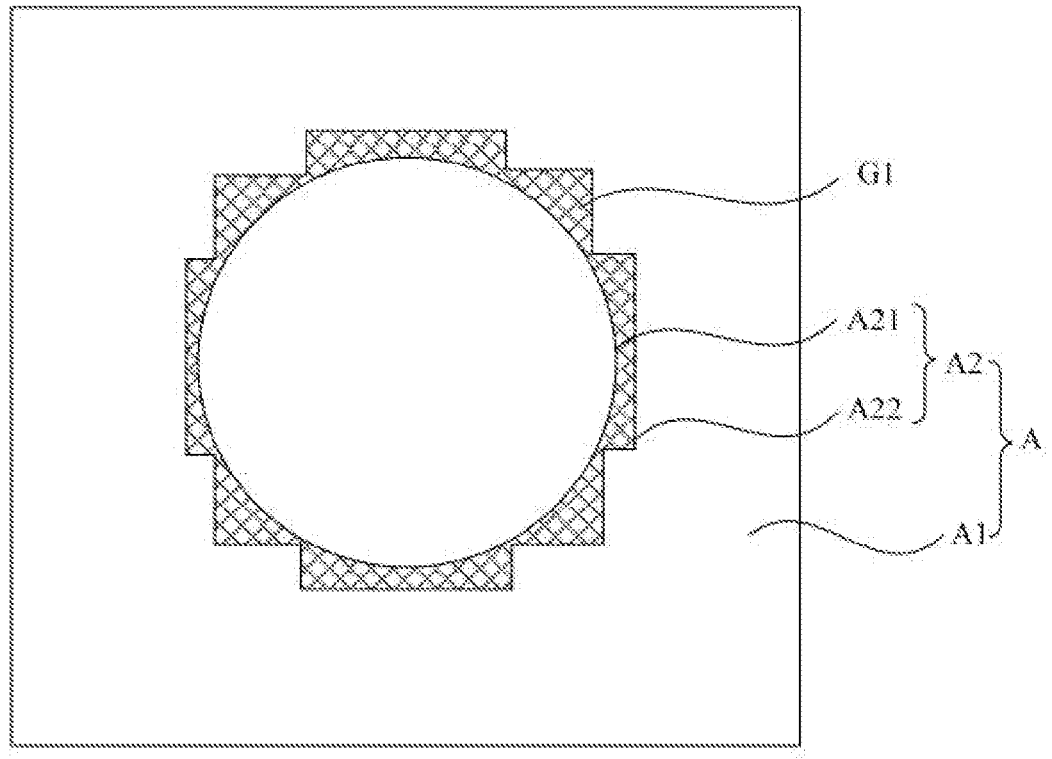
Figure 19:
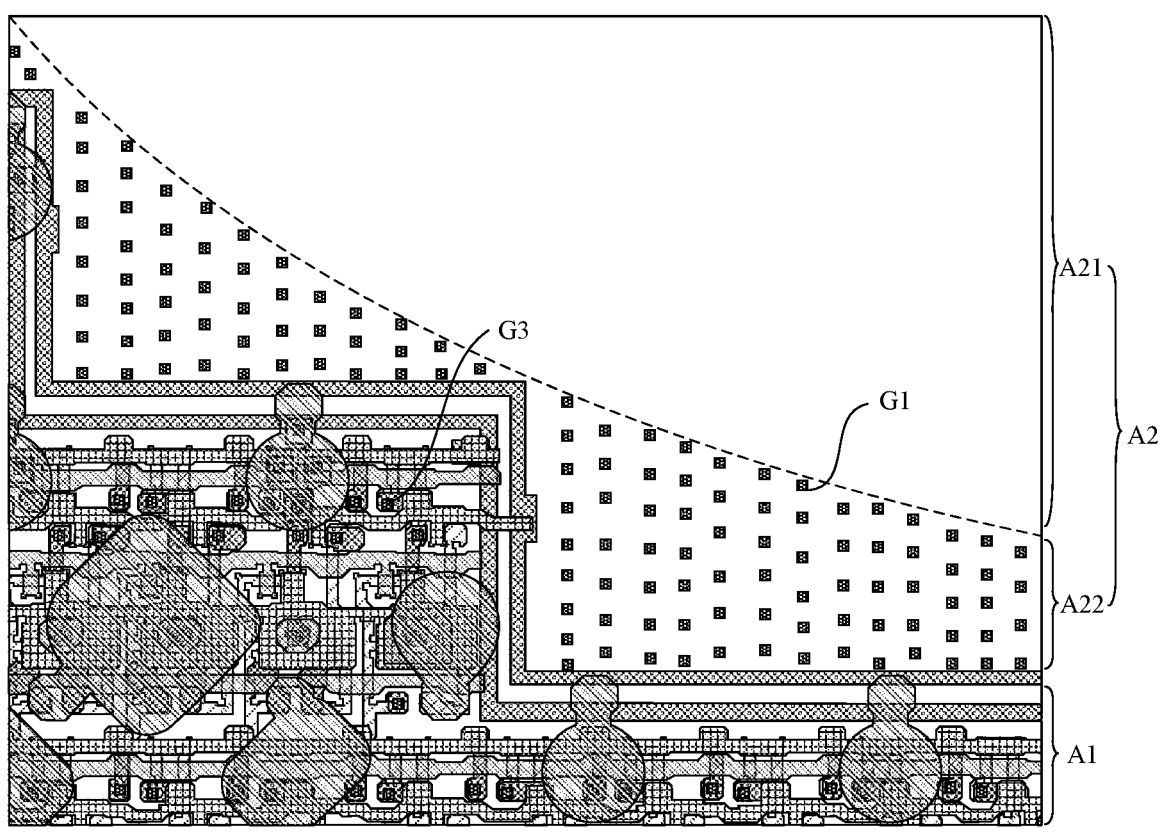
Figure 20:
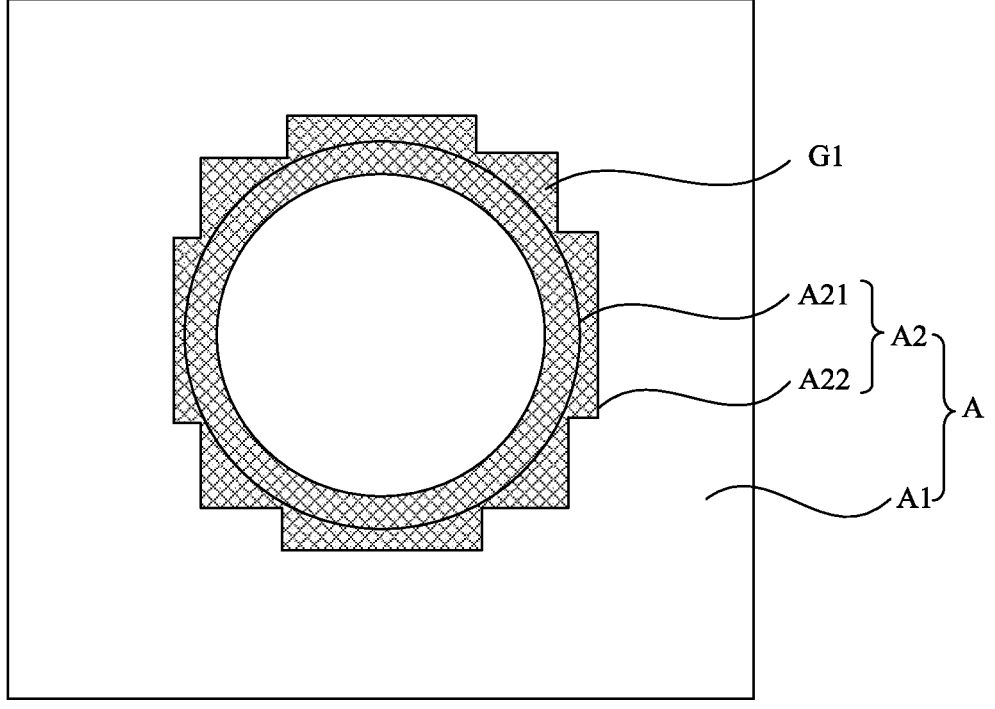
Figure 21:
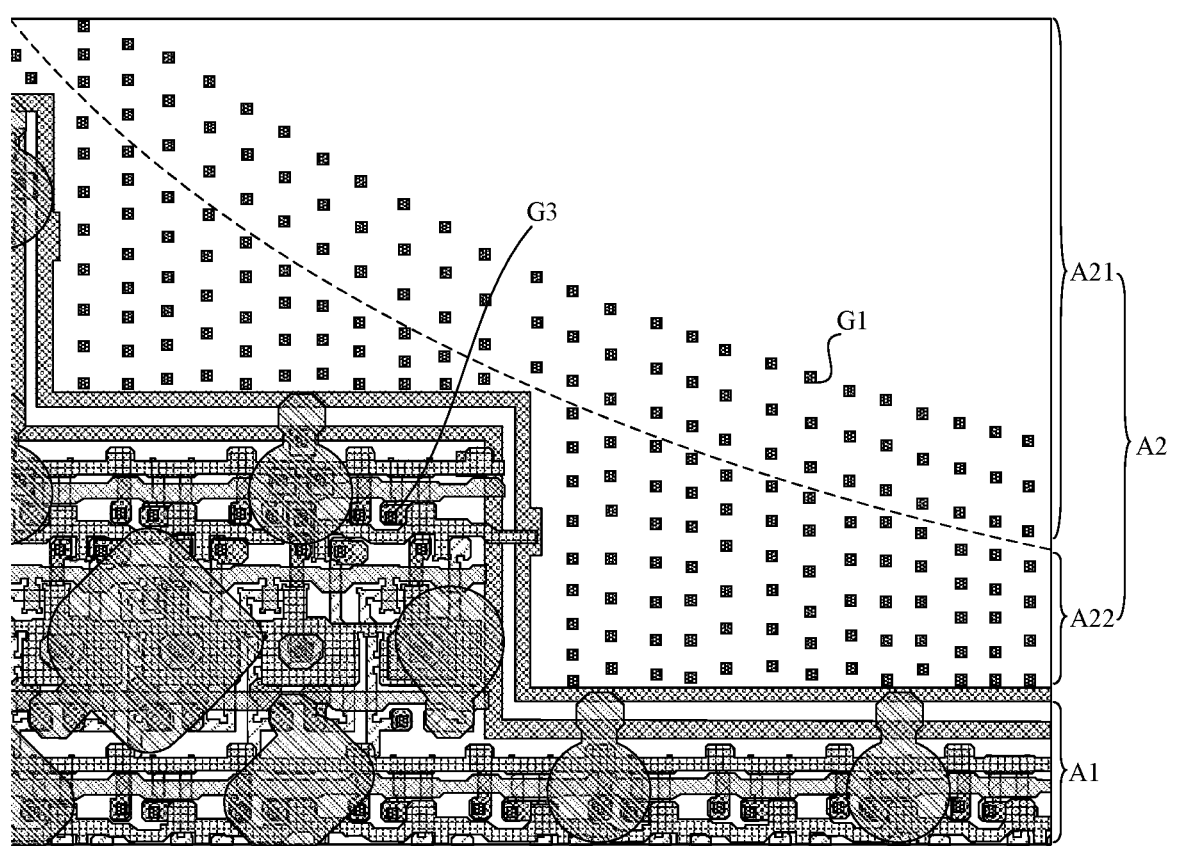
Figure 22:
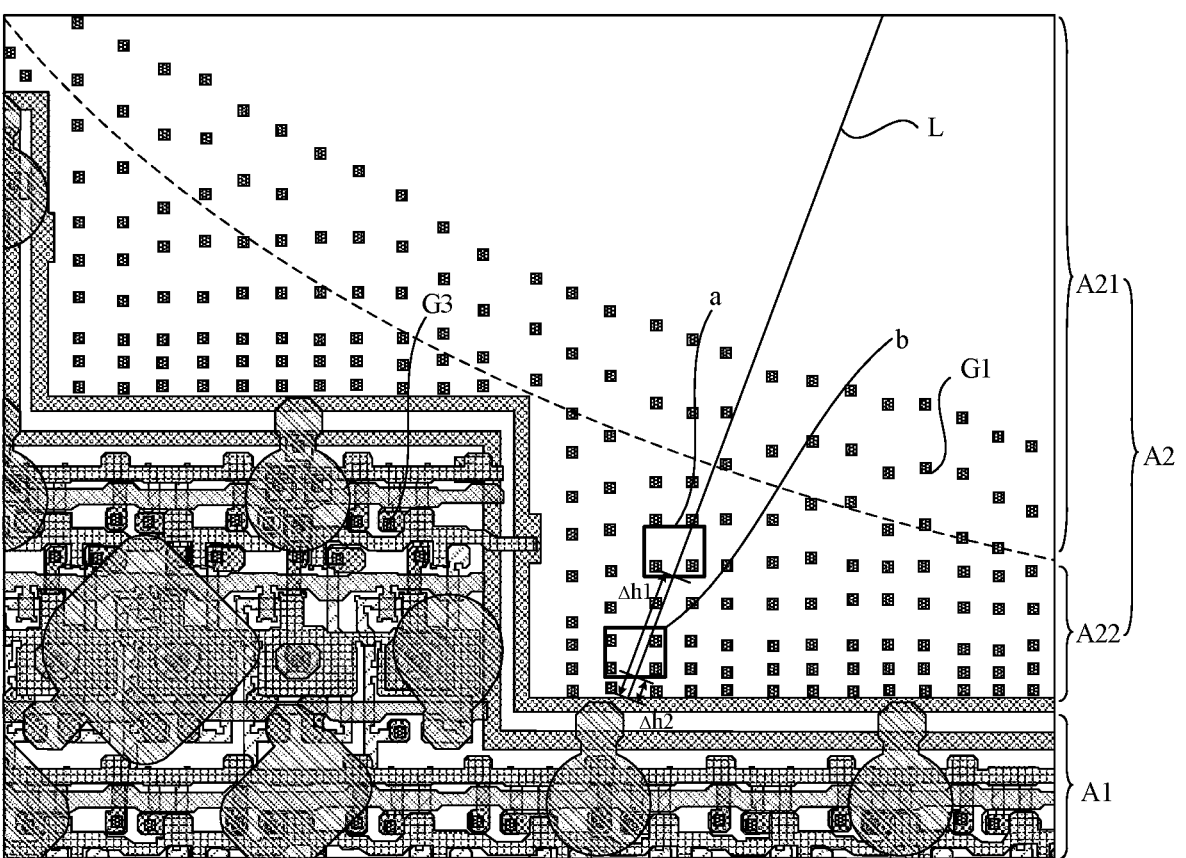
Figure 23:
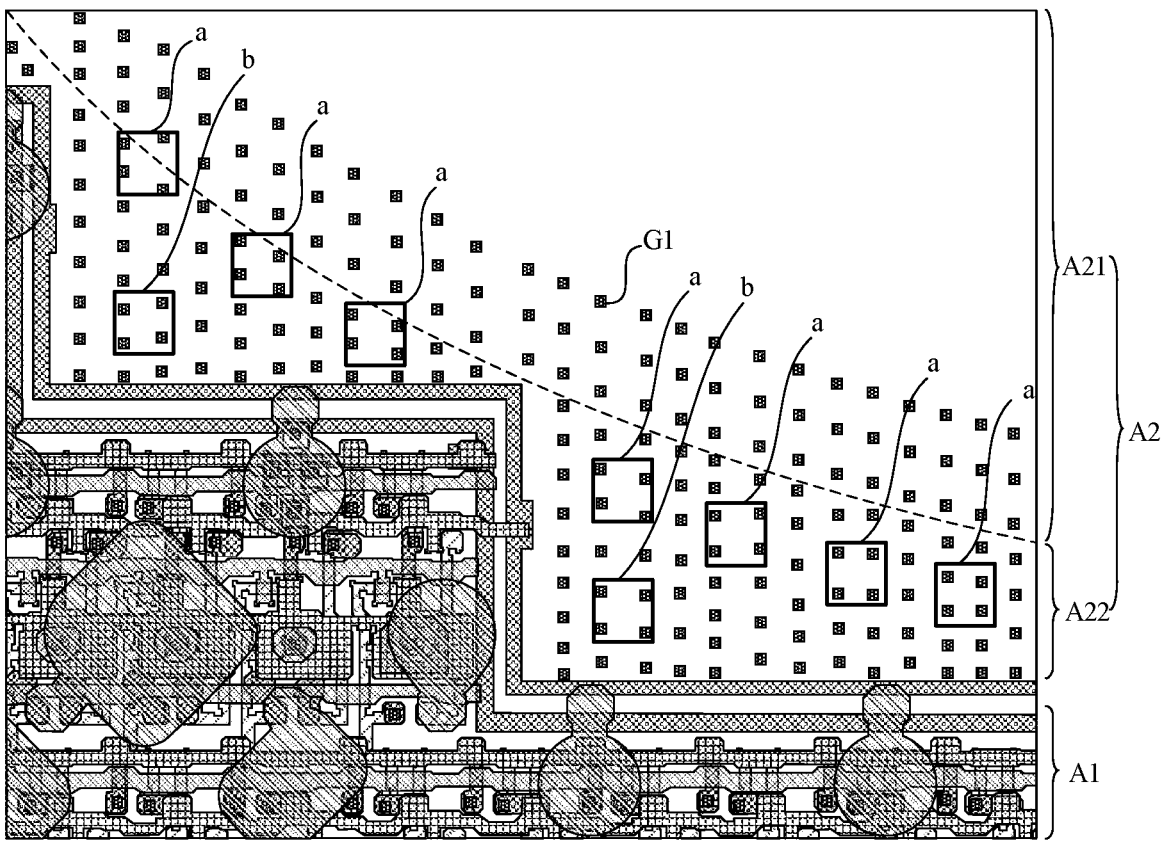
Figure 24:
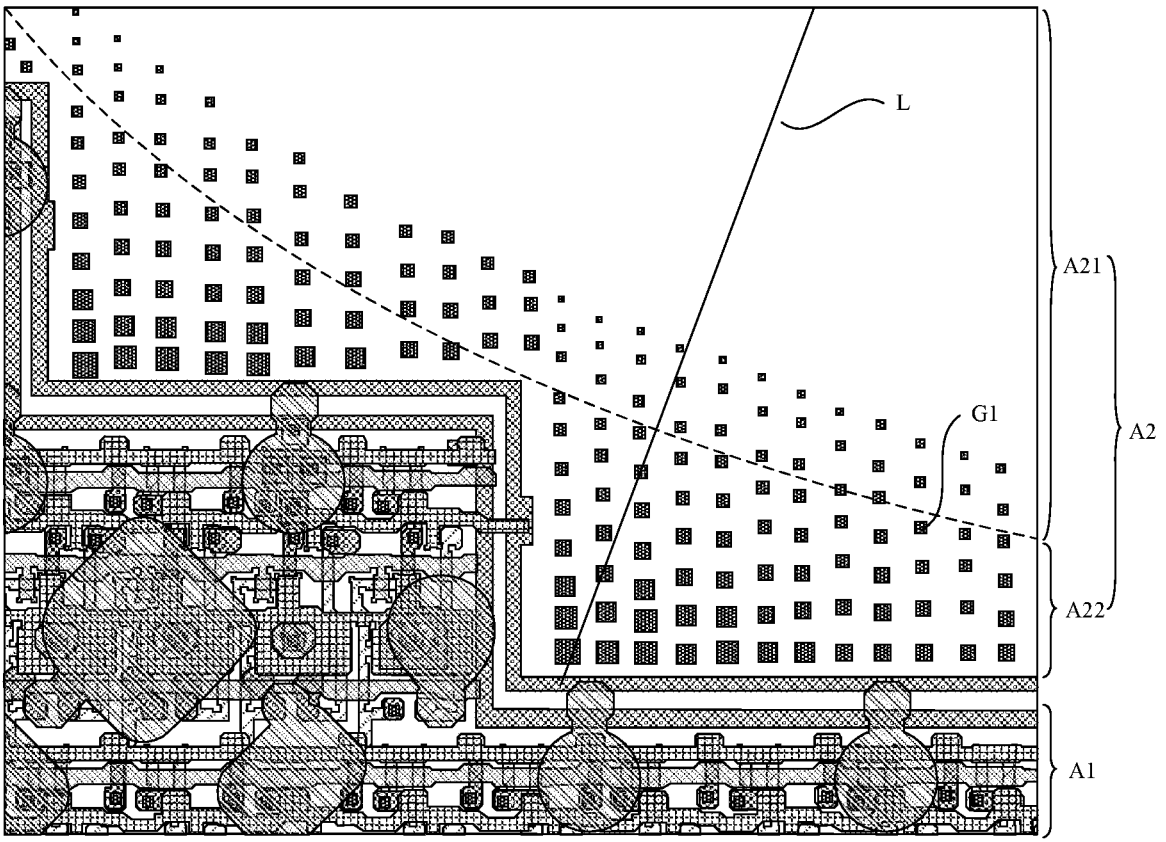
Figure 25:
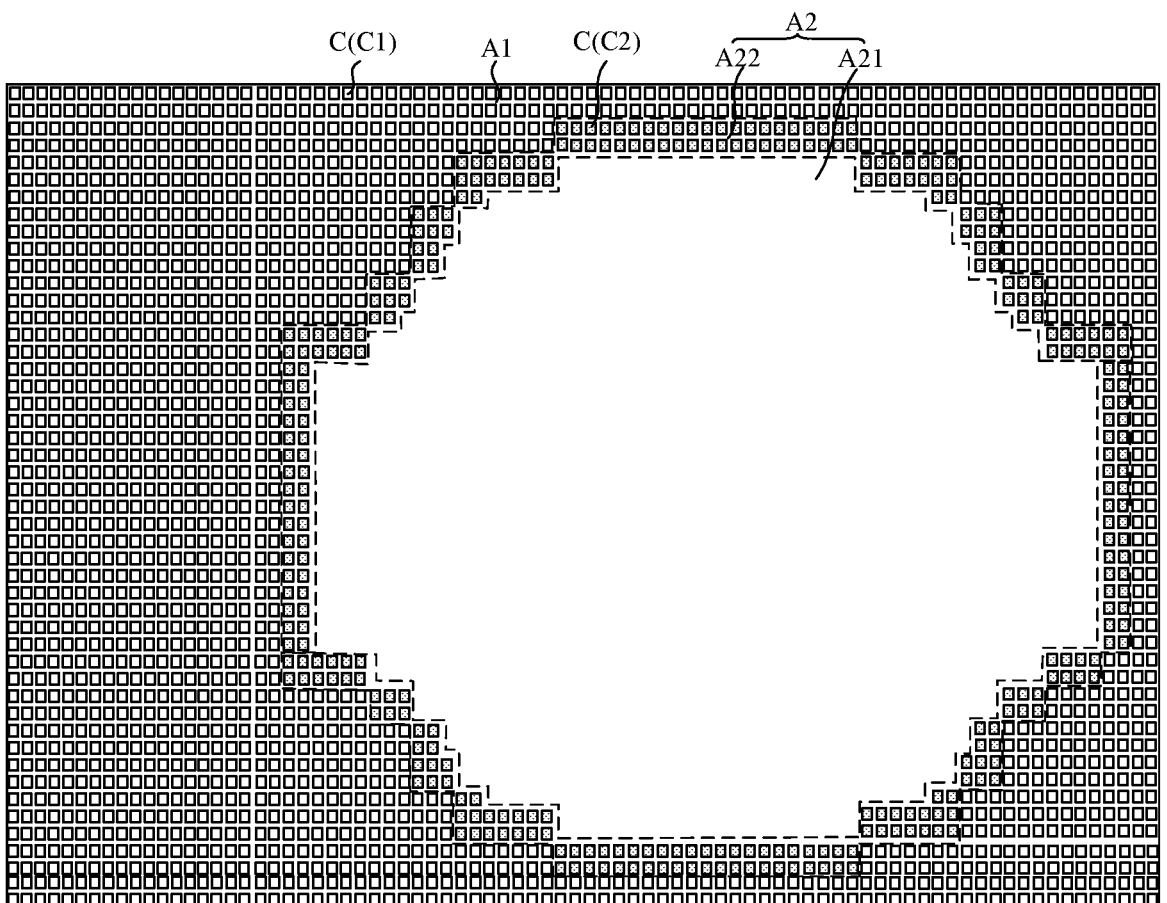
Figure 26:
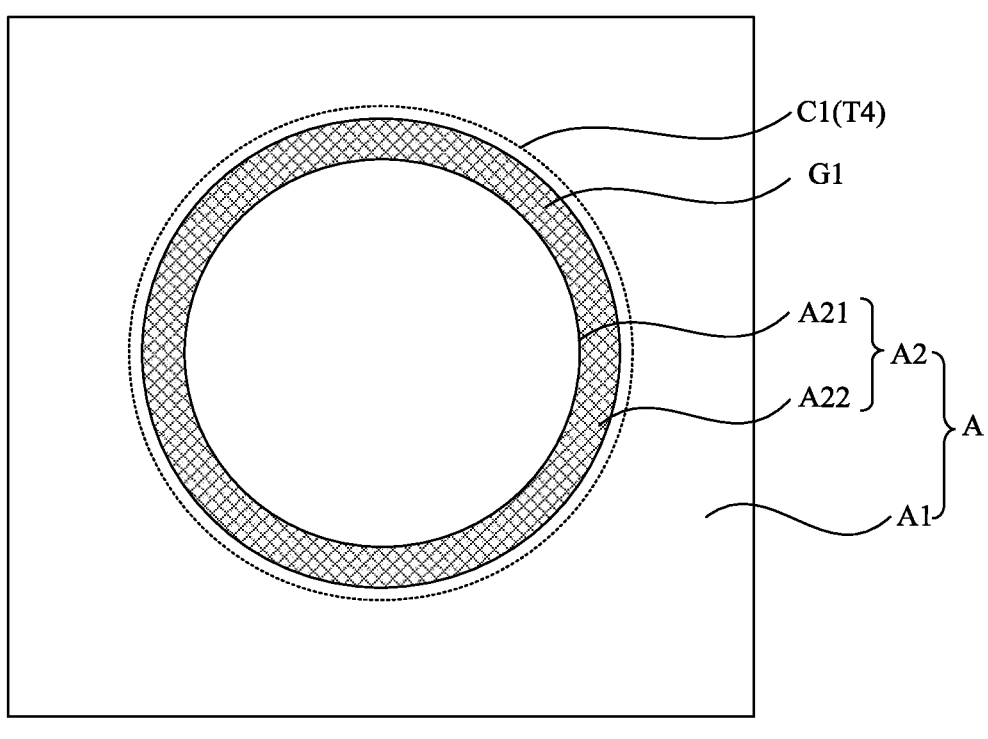
Figure 27:
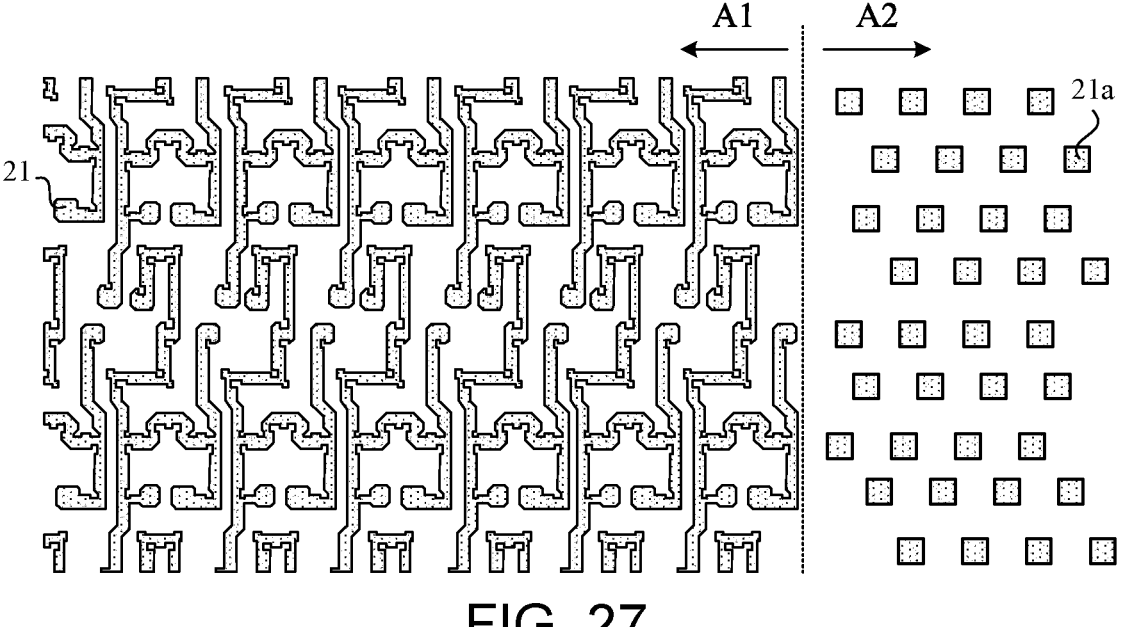
Figure 28:
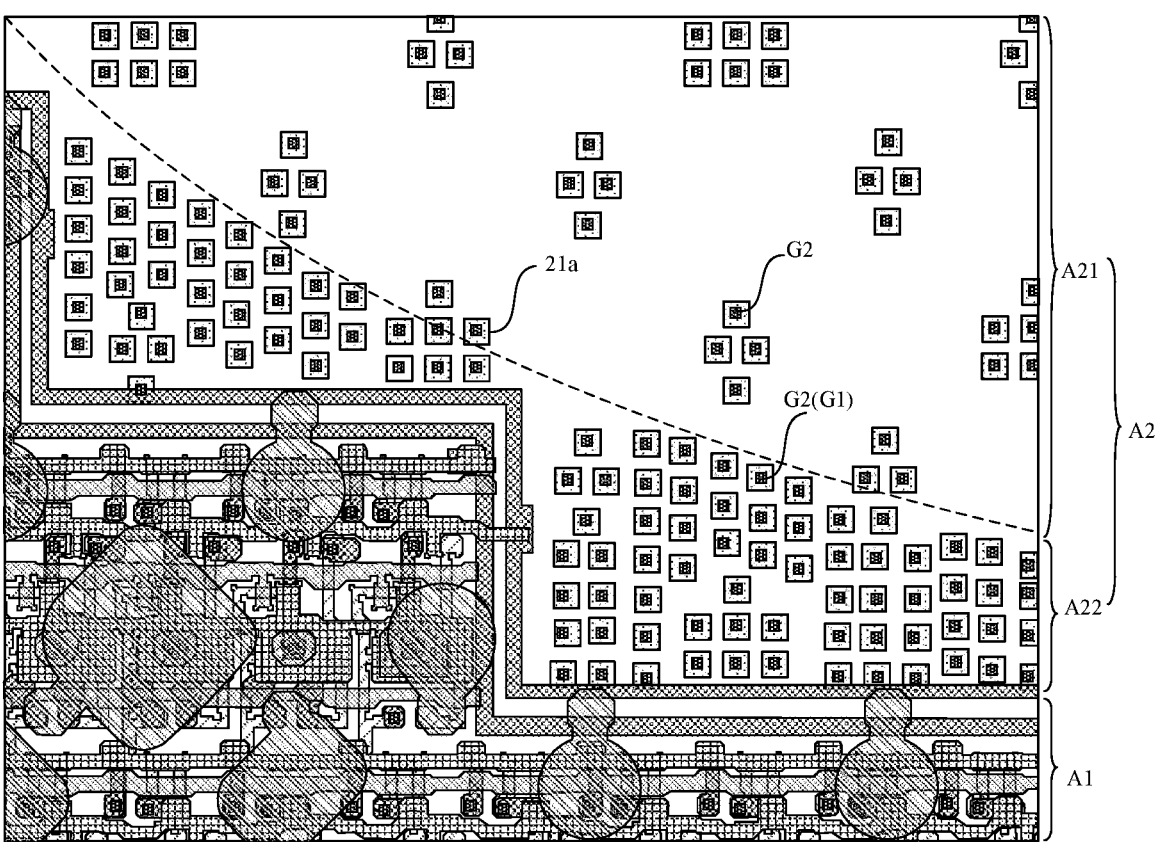
Figure 29:
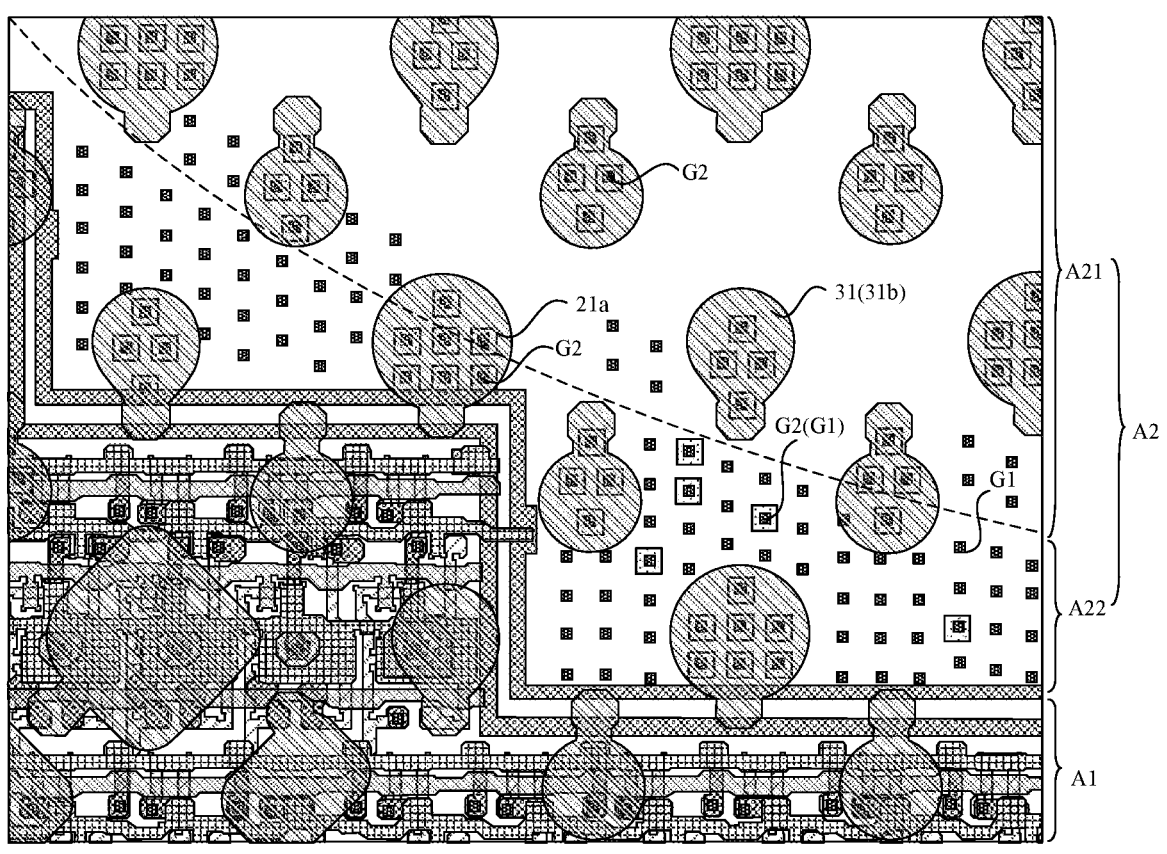
Figure 30:
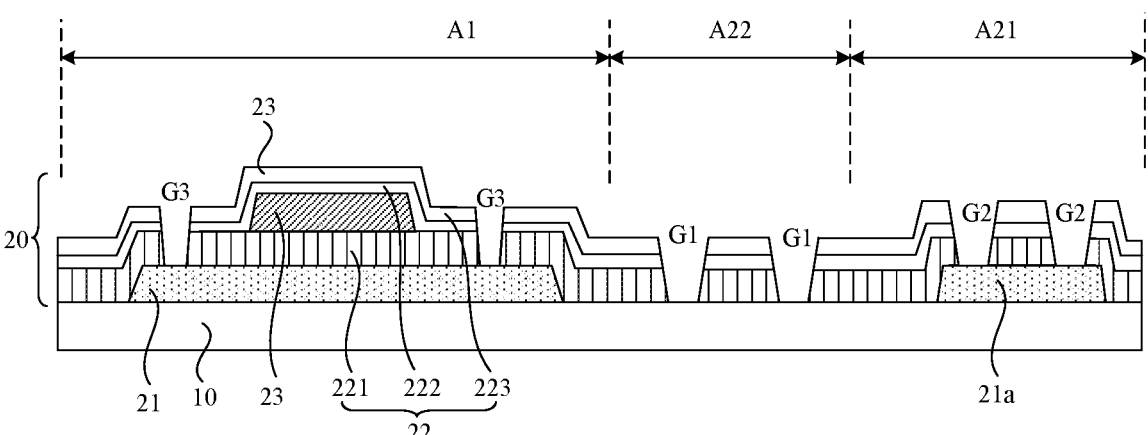
Figure 31:
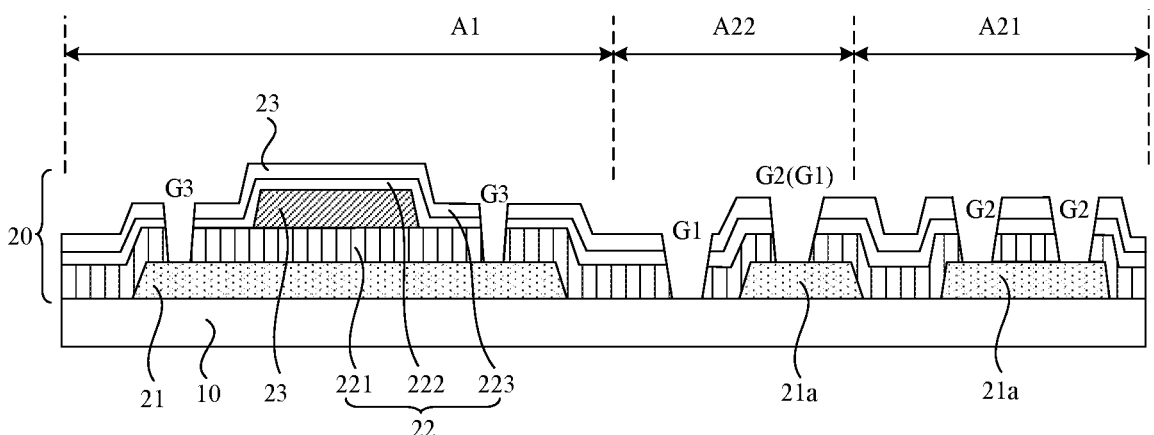
Figure 32:
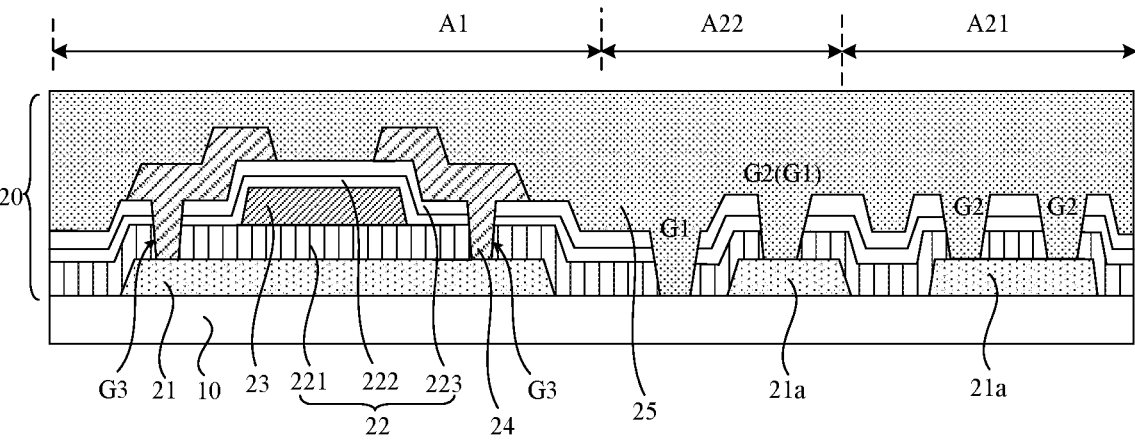

FIG. 13 is a top view of yet some other film layers of a pixel circuit layer, in accordance with some embodiments of the present disclosure;

FIG. 14 is a structural diagram of yet some other film layers of a pixel circuit layer, in accordance with some embodiments of the present disclosure;

FIG. 15 is a structural diagram of yet some other film layers of a pixel circuit layer, in accordance with some embodiments of the present disclosure;

FIG. 16 is a structural diagram of yet some other film layers of a pixel circuit layer, in accordance with some embodiments of the present disclosure;

FIG. 17 is a diagram showing a dark ring appearing on a display substrate in an implementation;

FIG. 18 is a partial enlarged view of a display substrate, in accordance with some embodiments of the present disclosure;

FIG. 19 is a partial enlarged view of the display substrate shown in FIG. 18;

FIG. 20 is a partial enlarged view of another display substrate, in accordance with some embodiments of the present disclosure;

FIG. 21 is a partial enlarged view of the display substrate shown in FIG. 20;

FIG. 22 is a partial enlarged view of a display substrate, in accordance with some embodiments of the present disclosure;

FIG. 23 is a partial enlarged view of another display substrate, in accordance with some embodiments of the present disclosure;

FIG. 24 is a partial enlarged view of yet another display substrate, in accordance with some embodiments of the present disclosure;

FIG. 25 is a structural diagram of yet another display substrate, in accordance with some embodiments of the present disclosure;

FIG. 26 is a partial enlarged view of yet another display substrate, in accordance with some embodiments of the present disclosure;

FIG. 27 is a structural diagram of yet some other film layers of a pixel circuit layer, in accordance with some embodiments of the present disclosure;

FIG. 28 is a partial enlarged view of yet another display substrate, in accordance with some embodiments of the present disclosure;

FIG. 29 is a partial enlarged view of yet another display substrate, in accordance with some embodiments of the present disclosure;

FIG. 30 is a structural diagram of yet some other film layers of a pixel circuit layer, in accordance with some embodiments of the present disclosure;

FIG. 31 is a structural diagram of yet some other film layers of a pixel circuit layer, in accordance with some embodiments of the present disclosure; and FIG. 32 is a structural diagram of yet some other film layers of a pixel circuit layer, in accordance with some embodiments of the present disclosure.

DETAILED DESCRIPTION

The technical solutions in some embodiments of the present disclosure will be described clearly and completely with reference to the accompanying drawings. However, the described embodiments are merely some but not all of embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed in an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representation of the above terms does not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, a feature defined with the term such as "first" or "second" may explicitly or implicitly include one or more features. In the description of the embodiments of the present disclosure, the terms "a plurality of", "the plurality of" and "multiple" each mean two or more unless otherwise specified.

Some embodiments may be described using the terms "coupled", "connected" and their derivatives. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "A and/or B" includes the following three combinations: only A, only B, and a combination of A and B.

As used herein, depending on the context, the term "if" is optionally construed as "when", "in a case where", "in response to determining" or "in response to detecting". Similarly, depending on the context, the phrase "if it is determined" or "if [a stated condition or event] is detected" is optionally construed as "in a case where it is determined", "in response to determining", "in a case where [the stated condition or event] is detected", or "in response to detecting [the stated condition or event]".

The phase "applicable to" or "configured to" as used herein indicates an open and inclusive expression, which does not exclude devices that are applicable to or configured to perform additional tasks or steps.

In addition, the use of the phase "based on" means openness and inclusiveness, since a process, step, calculation or other action that is "based on" one or more of the stated conditions or values may, in practice, be based on additional conditions or values exceeding those stated.

The term such as "about", "substantially" or "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

The term such as "perpendicular" or "equal" as used herein includes a stated condition and a condition similar to the stated condition. A range of the similar condition is within an acceptable deviation range, where the acceptable deviation range is determined by a person of ordinary skill in the art, considering measurement in question and errors associated with measurement of a particular quantity (i.e., limitations of a measurement system). For example, the term "perpendicular" includes absolute perpendicularity and approximate perpendicularity, and an acceptable range of deviation of the approximate perpendicularity may also be, for example, a deviation within 5 degrees. The term "equal" includes absolute equality and approximate equality, and an acceptable range of deviation of the approximate equality may be, for example, a difference between two equals being less than or equal to 5% of either of the two equals.

It will be understood that, in a case where a layer or component is referred to as being on another layer or a substrate, it may be that the layer or component is directly on the another layer or substrate; or it may be that intermediate layer(s) exist between the layer or component and the another layer or substrate.

Exemplary embodiments are described herein with reference to sectional views and/or plan views as idealized exemplary drawings. In the accompanying drawings, thicknesses of layers and areas of regions are enlarged for clarity. Thus, variations in shape with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of regions in an apparatus, and are not intended to limit the scope of the exemplary embodiments.

Some embodiments of the present disclosure provide a display substrate 100 and a display device 1000, and the display substrate 100 and the display device 1000 are described below.

Figures 1, 2:
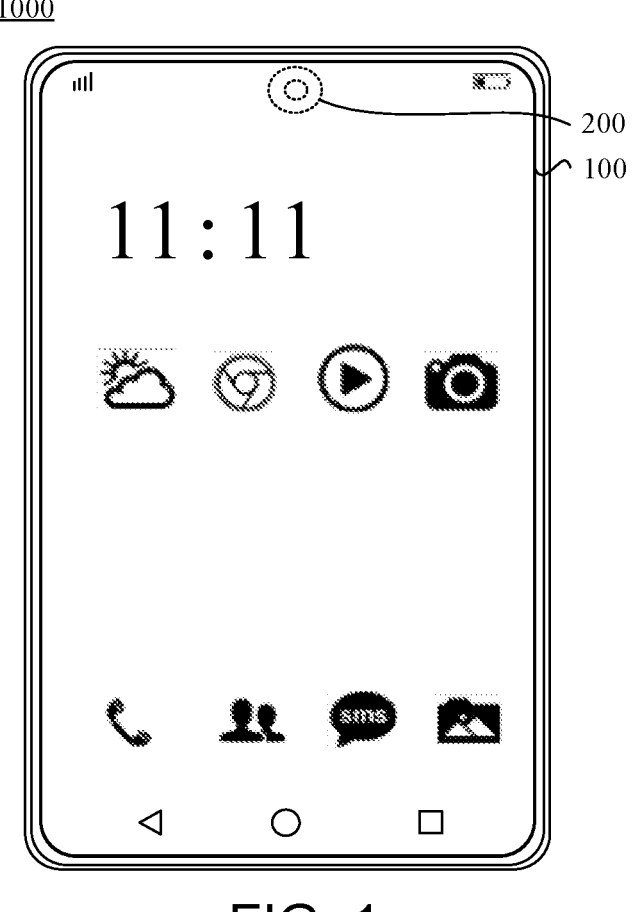
FIG. 1 is a structural diagram of a display device, in accordance with some embodiments of the present disclosure.
FIG. 2 is a structural diagram of another display device, in accordance with some embodiments of the present disclosure.

Some embodiments of the present disclosure provide the display device 1000, as shown in FIG. 1. The display device 1000 may be any device that displays images whether in motion (e.g., a video) or stationary (e.g., a still image), and regardless of text or image. More specifically, it is expected that the display device in the embodiments may be implemented in or associated with a variety of electronic devices. The variety of electronic devices are (but not limited to), for example, mobile phones, wireless apparatuses, personal data assistants (PDAs), hand-held or portable computers, GPS receivers/navigators, cameras, MPEG-4 Part 14 (MP4) video players, video cameras, game consoles, watches, clocks, calculators, television monitors, flat panel displays, computer monitors, automobile displays (e.g., odometer displays), navigators, cockpit controllers and/or displays, camera view displays (e.g., rear-view camera displays in vehicles), electronic photos, electronic billboards or signs, projectors, architectural structures, packaging and aesthetic structures (e.g., displays of images of a piece of jewelry).

In some examples, as shown in FIG. 2, the display device 1000 includes the display substrate 100.

For example, the display device 1000 further includes a frame, a display driver integrated circuit (IC) and other electronic components.

Figure 3:
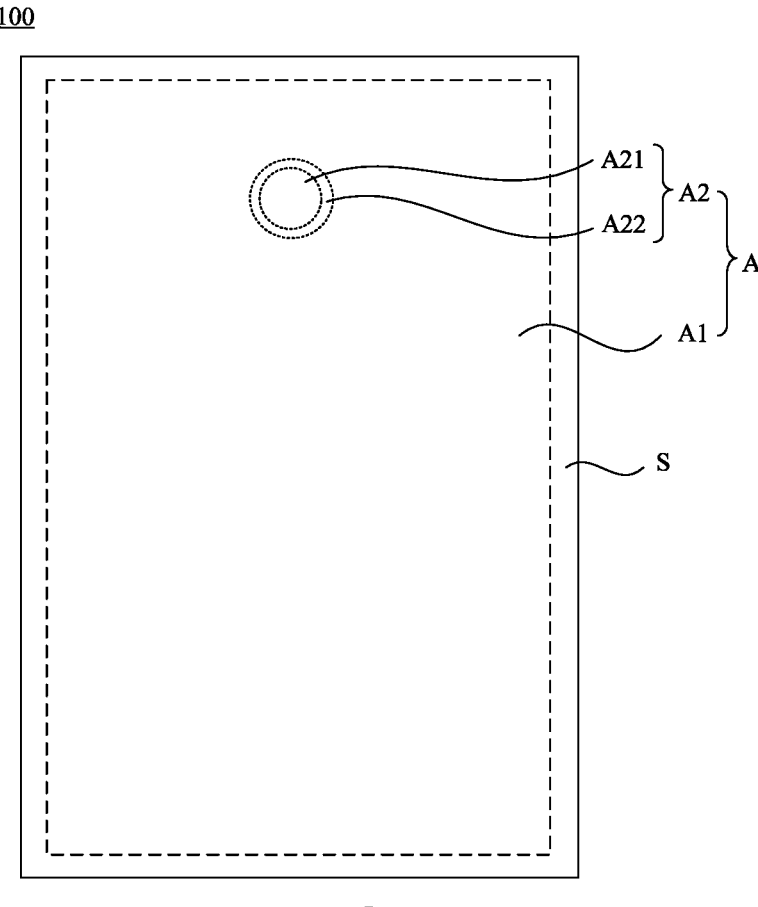
FIG. 3 is a structural diagram of a display substrate, in accordance with some embodiments of the present disclosure.

In some examples, as shown in FIGS. 2 and 3, the display substrate 100 has a display region A. As shown in FIG. 3, the display substrate 100 further has a bezel region S surrounding the display region A.

For example, as shown in FIGS. 2 and 3, the display region A includes a primary display region A1 and a secondary display region A2. The primary display region A1 surrounds the secondary display region A2.

The present disclosure does not limit the shapes of the display region A and the secondary display region A2, which may be determined according to actual needs.

For example, the shape of the display region A may be rectangle, approximately rectangle, circle, or ellipse. The approximate rectangle is a rectangle in a non-strict sense, and its four inner corners may be, for example, rounded, or its certain side, for example, is not a straight line.

For example, the shape of the secondary display region A2 is any one of circle, ellipse, and polygon. The polygon may be, for example, a quadrilateral, a pentagon, or a hexagon.

It should be noted that, from a macro perspective, a border of the secondary display region A2 is composed of smooth lines. From a micro perspective, the border of the secondary display region A2 may include smooth lines, or may include jagged lines.

Figure 4:
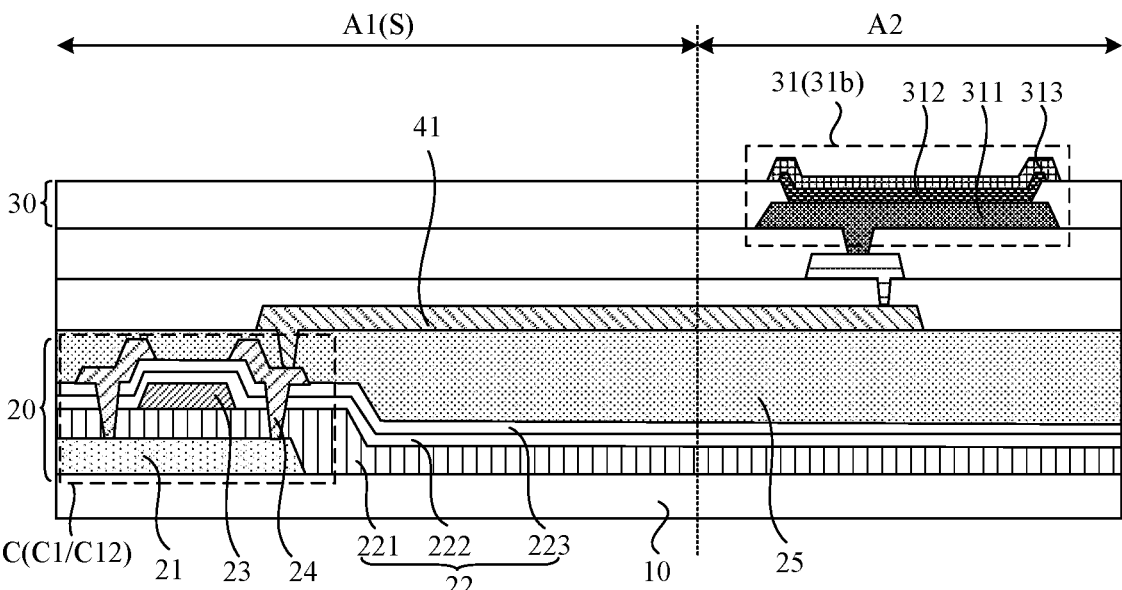
FIG. 4 is a structural diagram of another display substrate, in accordance with some embodiments of the present disclosure.
Figure 5:
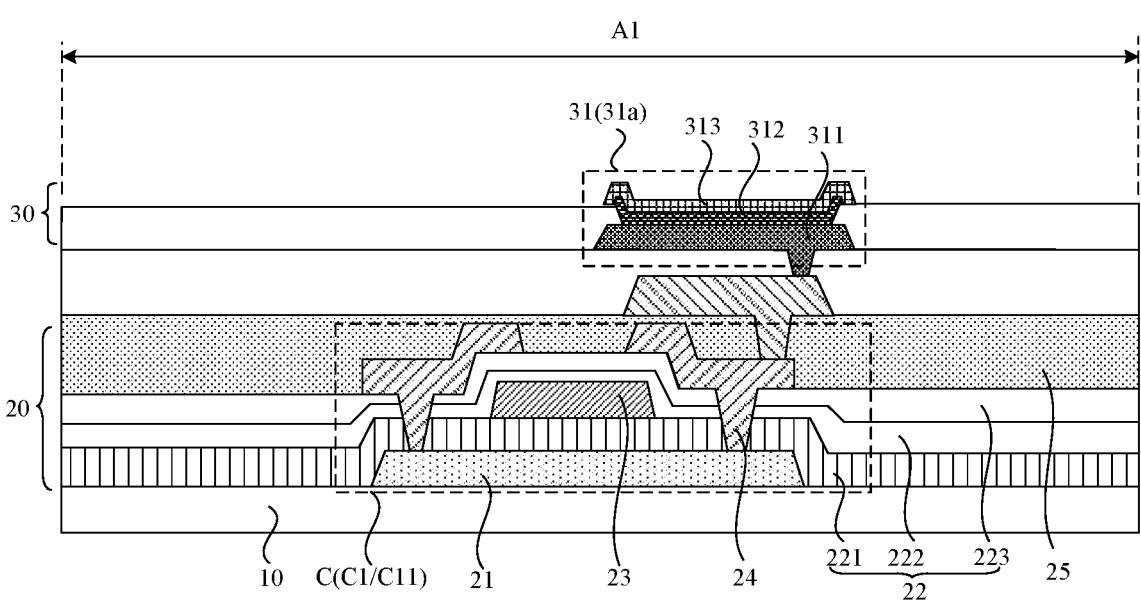
FIG. 5 is a structural diagram of yet another display substrate, in accordance with some embodiments of the present disclosure.

In some embodiments, as shown in FIGS. 4 and 5, the display substrate 100 includes a substrate 10.

A structure of the substrate 10 varies, which may be determined according to actual needs.

For example, the substrate 10 may be a rigid substrate. The rigid substrate may be, for example, a glass substrate or a polymethyl methacrylate (PMMA) substrate. In this case, the display substrate 100 may be a rigid display substrate.

As another example, the substrate 10 may be a flexible substrate. The flexible substrate may be, for example, a polyethylene terephthalate (PET) substrate, a polyethylene naphthalate (PEN) substrate or a polyimide (PI) substrate. In this case, the display substrate 100 may be a flexible display substrate.

In some examples, as shown in FIGS. 4 and 5, the display substrate 100 further includes a pixel circuit layer 20 disposed on the substrate 10.

For example, the pixel circuit layer 20 includes a plurality of pixel circuits C. The plurality of pixel circuits C may include a plurality of display pixel circuits C1.

Figure 8:
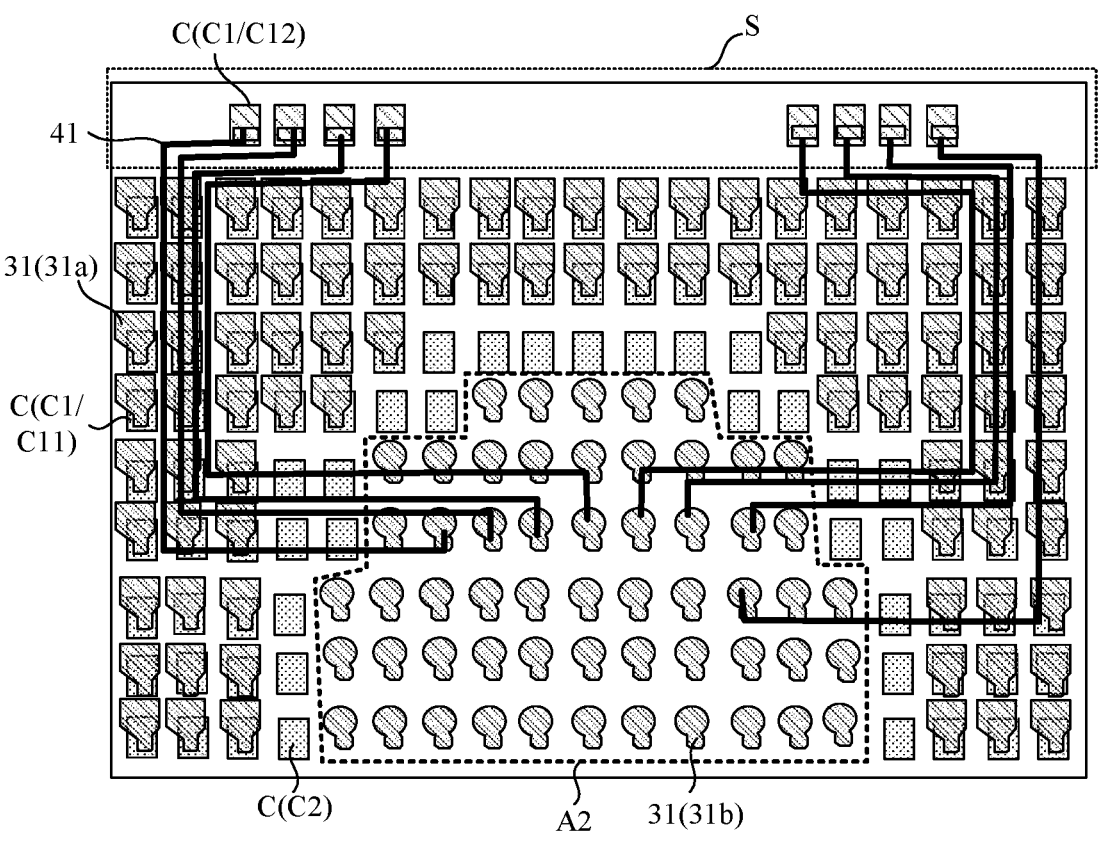
FIG. 8 is a structural diagram of yet another display substrate, in accordance with some embodiments of the present disclosure.

Optionally, as shown in FIG. 8, the plurality of pixel circuits C may further include a plurality of redundant pixel circuits C2. As for the plurality of redundant pixel circuits C2, reference may be made to the following description, which will not be provided here.

It can be understood that, as shown in FIG. 8, the display pixel circuits C1 and the redundant pixel circuits C2 may have the same structure. The description is illustrated below by taking the display pixel circuit C1 as an example.

The structure of the display pixel circuit C1 varies, which may be determined according to actual needs. For example, the structure of the display pixel circuit C1 may include a structure of "2T1C," "6T1C," "7T1C," "6T2C," or "7T2C". Here, "T" represents a transistor, a number in front of "T" represents the number of transistors, "C" represents a storage capacitor, and a number in front of "C" represents the number of storage capacitors.

It should be noted that, FIGS. 4 and 5 each schematically show only one transistor, which is used to represent the display pixel circuit C1 in the present disclosure.

Figure 6:
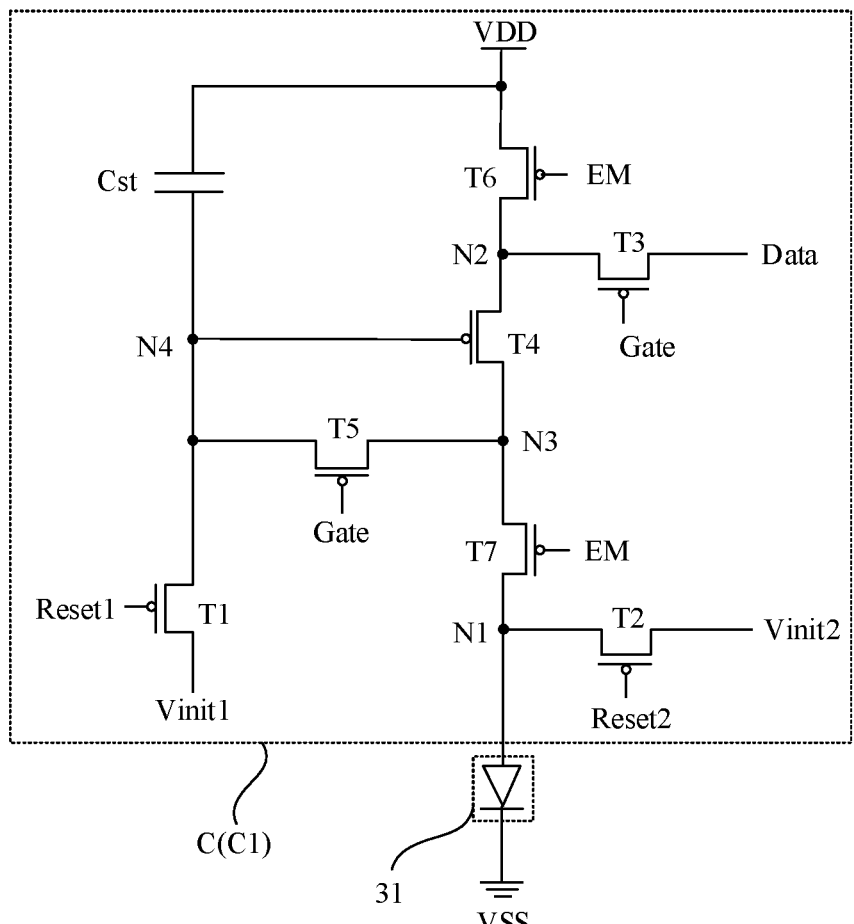
FIG. 6 is an equivalent circuit diagram of a display pixel circuit, in accordance with some embodiments of the present disclosure.

The display pixel circuit C1 in the present disclosure is described by taking a structure of "7T1C" as an example. FIG. 6 shows an equivalent circuit diagram of the display pixel circuit C1.

For example, as shown in FIG. 6, the display pixel circuit C1 includes: a first reset transistor T1, a second reset transistor T2, a switching transistor T3, a driving transistor T4, a compensation transistor T5, a first light-emitting control transistor T6, a second light-emitting control transistor T7, and a storage capacitor Cst.

For example, as shown in FIG. 6, a gate of the first reset transistor T1 is coupled to a first reset signal line Reset1, a first electrode of the first reset transistor T1 is coupled to a first initial signal line Vinit1, and a second electrode of the first reset transistor T1 is coupled to a fourth node N4. A gate of the second reset transistor T2 is coupled to a second reset signal line Reset2, a first electrode of the second reset transistor T2 is coupled to a second initial signal line Vinit2, and a second electrode of the second reset transistor T2 is coupled to a first node N1. A gate of the switching transistor T3 is coupled to a scanning signal line Gate, a first electrode of the switching transistor T3 is coupled to a data line Data, and a second electrode of the switching transistor T3 is coupled to a second node N2. A gate of the driving transistor T4 is coupled to the fourth node N4, a first electrode of the driving transistor T4 is coupled to the second node N2, and a second electrode of the driving transistor T4 is coupled to a third node N3. A gate of the compensation transistor T5 is coupled to the scanning signal line Gate, a first electrode of the compensation transistor T5 is coupled to the third node N3, and a second electrode of the compensation transistor T5 is coupled to the fourth node N4. A gate of the first light-emitting control transistor T6 is coupled to an enable signal line EM, a first electrode of the first light-emitting control transistor T6 is coupled to a first voltage signal line VDD, and a second electrode of the first light-emitting control transistor T6 is coupled to the second node N2. A gate of the second light-emitting control transistor T7 is coupled to the enable signal line EM, a first electrode of the second light-emitting control transistor T7 is coupled to the third node N3, and a second electrode of the second light-emitting control transistor T7 is coupled to the first node N1. A first electrode of the storage capacitor Cst is coupled to the fourth node N4, and a second electrode of the storage capacitor Cst is coupled to the first voltage signal line VDD.

Optionally, an operation process of the display pixel circuit C1 includes a reset phase P1, a data writing and compensation phase P2, and a light-emitting phase P3 that are performed in sequence.

For example, in the reset phase, under control of a first reset signal provided by the first reset signal line Reset1, the first reset transistor T1 is turned on, and transmits a first initialization signal provided by the first initialization signal line Vinit1 to the fourth node N4 to reset the fourth node N4.

For example, in the data writing and compensation phase, the second reset transistor T2 is turned on under control of a second reset signal provided by the second reset signal line Reset2, and transmits a second initial signal provided by the second initial signal line Vinit2 to the first node N1, so as to reset the first node N1. The switching transistor T3 and the compensation transistor T5 are turned on under control of a scanning signal provided by the scanning signal line Gate, the switching transistor T3 transmits a data signal provided by the data line Data to the second node N2, and the driving transistor T4 transmits the data signal from the second node N2 to the third node N3. The compensation transistor T5 transmits the data signal from the third node N3 to the fourth node N4 to charge the driving transistor T4 until the compensation for the threshold voltage of the driving transistor T4 is completed.

For example, in the light-emitting phase, the first light-emitting control transistor T6 and the second light-emitting control transistor T7 are simultaneously turned on under control of an enable signal provided by the enable signal line EM. The first light-emitting control transistor T6 transmits a first voltage signal to the second node N2. The driving transistor T4 generates a driving signal (e.g., a driving current) according to the first voltage signal from the second node N2 and the data signal from the fourth node N4, and transmits the data signal to the third node N3. The second light-emitting control transistor T7 transmits the data signal from the third node N3 to the first node N1.

In some examples, as shown in FIGS. 4 and 5, the display substrate further includes a light-emitting device layer 30 disposed on the pixel circuit layer 20. The light-emitting device layer 30 includes a plurality of light-emitting devices 31.

For example, the light-emitting device 31 may be an organic light-emitting diode (OLED) device.

For example, as shown in FIGS. 4 and 5, the light-emitting device 31 includes an anode 311, a light-emitting layer 312, and a cathode 313.

Optionally, the light-emitting device 31 may further include a hole injection layer and/or a hole transport layer disposed between the anode 311 and the light-emitting layer 312. The light-emitting device 31 may further include an electron transport layer and/or an electron injection layer disposed between the light-emitting layer 312 and the cathode 313.

For example, the plurality of display pixel circuits C1 may be electrically connected to the plurality of light-emitting devices 31 (e.g., the anodes 311 of the light-emitting devices 31). The plurality of display pixel circuits C1 may be electrically connected to the plurality of light-emitting devices 31 in various manners, which may be determined according to actual needs.

For example, the plurality of display pixel circuits C1 and the plurality of light-emitting devices 31 may be electrically connected in one-to-one correspondence. As another example, one display pixel circuit C1 may be coupled to multiple light emitting devices 31. As another example, multiple display pixel circuits C1 may be coupled to one light emitting device 31.

In the display substrate 100, the display pixel circuit C1 may generate a driving current. Each light-emitting device 31 may emit light under drive of a driving current generated by a corresponding display pixel circuit C1. Light emitted by the plurality of light-emitting devices 31 cooperate to enable the display substrate 100 to display images.

In the present disclosure, the structure of the display substrate 100 will be schematically described below by taking an example in which one display pixel circuit C1 is coupled to one light-emitting device 31.

For example, as shown in FIGS. 4, 5, 7 and 8, the plurality of display pixel circuits C1 includes a plurality of first display pixel circuits C11 and a plurality of second display pixel circuits C12. The plurality of light-emitting devices 31 includes: a plurality of primary light-emitting devices 31a located in the primary display region A1, and a plurality of secondary light-emitting devices 31b located in the secondary display region A2. The plurality of primary light-emitting devices 31*a* are electrically connected to the plurality of first display pixel circuits C11, and the plurality of secondary light-emitting devices 31*b* are electrically connected to the plurality of second display pixel circuits C12.

In this way, the first display pixel circuits C11 may drive the primary light-emitting devices 31*a* located in the primary display region A1 to emit light, and the second display pixel circuits C12 may drive the secondary light-emitting devices 31*b* located in the secondary display region A2 to emit light.

Optionally, the plurality of first display pixel circuits C11 are located in the primary display region A1, and the plurality of second display pixel circuits C12 are located in a region outside the secondary display region A2.

It will be noted that, the arrangement of the plurality of second display pixel circuits C12 varies, which may be determined according to actual needs.

Figure 7:
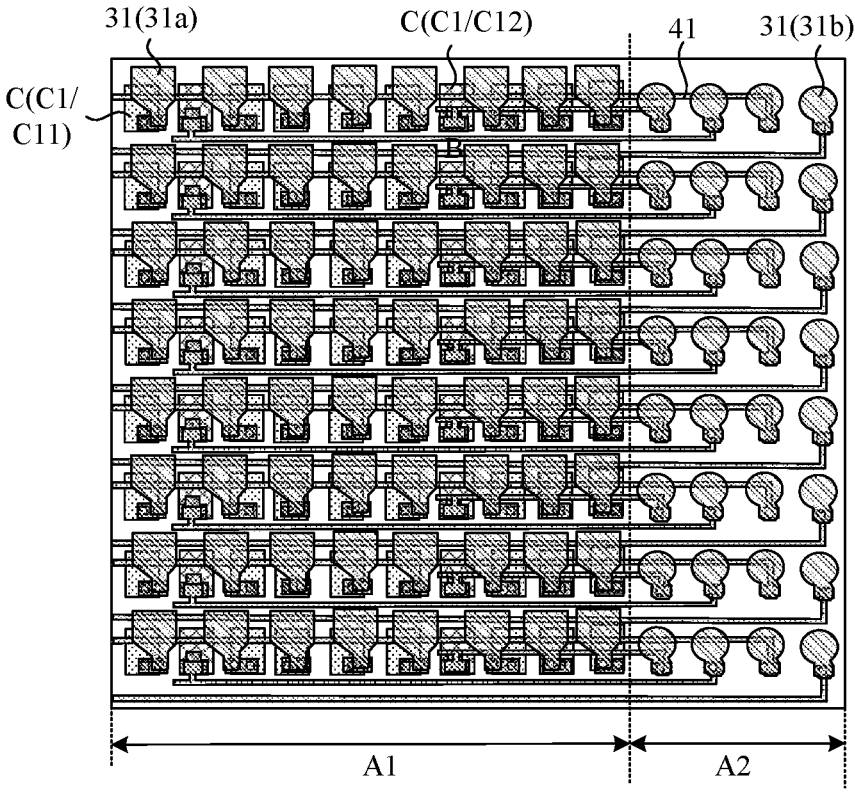
FIG. 7 is a structural diagram of yet another display substrate, in accordance with some embodiments of the present disclosure.

For example, as shown in FIG. 7, the plurality of second display pixel circuits C12 are arranged in the primary display region A1. The plurality of second display pixel circuits C12 are, for example, arranged in rows and columns, and at least one column of first display pixel circuits C11 may be arranged between any two adjacent columns of second display pixel circuits C12.

For example, in the present disclosure, the plurality of second display pixel circuits C12 may be arranged in a local reduction manner. That is, the plurality of second display pixel circuits C12 are arranged in a partial region of the primary display region A1 adjacent to the secondary display region A2, and sizes of first display pixel circuits C11 and the second display pixel circuits C12 that are located in the partial region are smaller than sizes of first display pixel circuits C11 located in other region.

As another example, in the present disclosure, the plurality of second display pixel circuits C12 may be arranged in a global reduction manner. That is, sizes of the plurality of first display pixel circuits C11 and the plurality of second display pixel circuits C12 included in the display substrate 100 are all reduced.

Whether the local reduction manner or the global reduction manner is adopted, the present disclosure does not limit the number of columns of first display pixel circuit C11 arranged between any two adjacent columns of second display pixel circuits C12, which may be determined according to actual needs.

For example, the number of columns of first display pixel circuits C11 arranged between any two adjacent columns of second display pixel circuits C12 may be one, two or four.

In this way, it may be possible to avoid that the display pixel circuit C1 is arranged in the bezel region S, reduce the width of the bezel region S, and in turn improve the screen-to-body ratio of the display substrate 100 and the display device 1000.

For example, as shown in FIG. 8, the plurality of second display pixel circuits C12 are arranged in the bezel region S. FIG. 8 shows only part of the second display pixel circuits C12, and the number of the second display pixel circuits C12 located in the bezel region S is not limited thereto.

In this way, an area of the primary display region A1 for arranging the first display pixel circuits C11 may be increased, so that more first display pixel circuits C11 may be arranged in the primary display region A1, and the pixels per inch of the display substrate 100 is increased.

It can be known from the above that the plurality of display pixel circuits C1 included in the display substrate 100 are all located in the region outside the secondary display region A2, and the plurality of light-emitting devices 31 included in the display substrate 100 are all located in the display region A.

It can be understood that, a material of a partial structure of the display pixel circuit C1 includes a metal material, and the metal material has a low light transmittance and a high blocking effect on light. In the embodiments of the present disclosure, by arranging the second display pixel circuits C12, electrically connected to the secondary light-emitting devices 31*b* located in the secondary display region A2, in the region outside the secondary display region A2, the display substrate 100 may realize a full-screen display; in addition, when external light is incident on a portion of the display substrate 100 located in the secondary display region A2, it may avoid that the second display pixel circuits C12 block the external light. Therefore, the external light may be emitted through a gap between any two adjacent secondary light-emitting devices 31*b*. As a result, the portion of the display substrate 100 located in the secondary display region A2 has a high light transmittance.

For example, as shown in FIGS. 4, 7 and 8, the display substrate 100 further includes a transition layer located between the pixel circuit layer 20 and the light-emitting device layer 30. The transition layer includes a plurality of conductive lines 41. An end of each conductive line 41 is electrically connected to a second display pixel circuit C12, and another end of each conductive line 41 is electrically connected to a secondary light-emitting device 31*b*. That is, each second display pixel circuit C12 is electrically connected to a corresponding secondary light-emitting device 31*b* through a conductive line 41.

Optionally, a material of the conductive line 41 includes a light-transmissive conductive material, such as indium tin oxide (ITO). In this way, the light transmittance of the portion of the display substrate 100 located in the secondary display region A2 may be avoided from being affected.

In some examples, as shown in FIG. 2, the display device 1000 further includes an optical element 200 disposed on a non-light exit side of the display substrate 100, and the optical element 200 is located in the secondary display region A2 of the display substrate 100.

It can be understood that a light exit side refers to a side of the display substrate 100 that is capable of displaying images. The non-light exit side refers to a side of the display substrate 100 opposite to the light exit side.

For example, when light of the light-emitting device layer 30 exits towards a side of the light-emitting device layer 30 away from the substrate 10, the non-light exit side refers to a side of the substrate 10 away from the light-emitting device layer 30.

For example, the optical element 200 includes: a camera, an infrared sensor or a fingerprint sensor.

The present disclosure is described by taking an example in which the optical element 200 is a camera.

For example, during the working process of the camera, since the portion of the display substrate 100 located in the secondary display region A2 is provided with no display pixel circuit C1, it may be possible to avoid that the display pixel circuit C1 blocks the external light. Therefore, the external light may pass through the portion of the display substrate 100 located in the secondary display region A2. In this way, the camera may acquire the light to realize a photographing function.

For example, when the camera is not working, the portion of the display substrate 100 located in the secondary display region A2 can also display images, so that the entire display substrate 100 can display images, and a full-screen display is realized.

It should be noted that, as shown in FIG. 3, the secondary display region A2 of the display substrate 100 includes an element arrangement region A21 and a transition region A22 surrounding the element arrangement region A21.

For example, as shown in FIG. 3, the transition region A22 is closer to the primary display region A1 than the element arrangement region A21.

Further, in consideration of a viewing angle of the optical element 200 by those skilled in the art, an orthographic projection of the optical element 200 on the display substrate 100 may at least partially overlap the element arrangement region A21 of the display substrate 100. That is, the optical element 200 may be arranged in the element arrangement region A21, or there may be a certain misalignment between the optical element 200 and the element arrangement region A21. In this way, it is conducive to improving the working performance of the optical element 200.

In some embodiments, as shown in FIGS. 4 and 5, the pixel circuit layer 20 includes an active layer 21 and a multi-layer inorganic insulating layer 22 disposed on a side of the active layer 21 away from the substrate 10.

In some embodiments, the multi-layer inorganic insulating layer 22 includes, for example, a first gate insulating layer 221, a second gate insulating layer 222, and an interlayer insulating layer 223 that are stacked in sequence in a direction away from the substrate 10.

The pixel circuit layer 20 further includes, for example, a first gate conductive layer 23 located between the first gate insulating layer 221 and the second gate insulating layer 222, a second gate conductive layer 26 located between the second gate insulating layer 222 and the interlayer dielectric layer 223, and a source-drain conductive layer 24 located on a side of the interlayer dielectric layer 223 away from the substrate 10.

For example, the active layer 21 may be made of low temperature polysilicon (LTPS) or metal oxide. The metal oxide may be indium gallium zinc oxide (IGZO). The present disclosure is schematically described by taking an example in which the active layer 21 is made of LTPS.

For example, in the present disclosure, an LTPS film layer may be formed by using a chemical vapor deposition (CVD) method or a plasma enhanced chemical vapor deposition (PECVD) method, and the LTPS film layer is patterned through subsequent processes (such as an etching process), so as to form the active layer 21.

For example, the first gate insulating layer 221 and the second gate insulating layer 222 are each made of an inorganic material. The inorganic material may be at least one of silicon nitride, silicon oxide, and silicon oxynitride. A thickness of the first gate insulating layer 221 and a thicknesses of the second gate insulating layer 222 are relatively uniform.

For example, the interlayer dielectric layer 223 is made of an inorganic material. For example, the inorganic material may be at least one of silicon nitride, silicon oxide, and silicon oxynitride.

Figure 9:
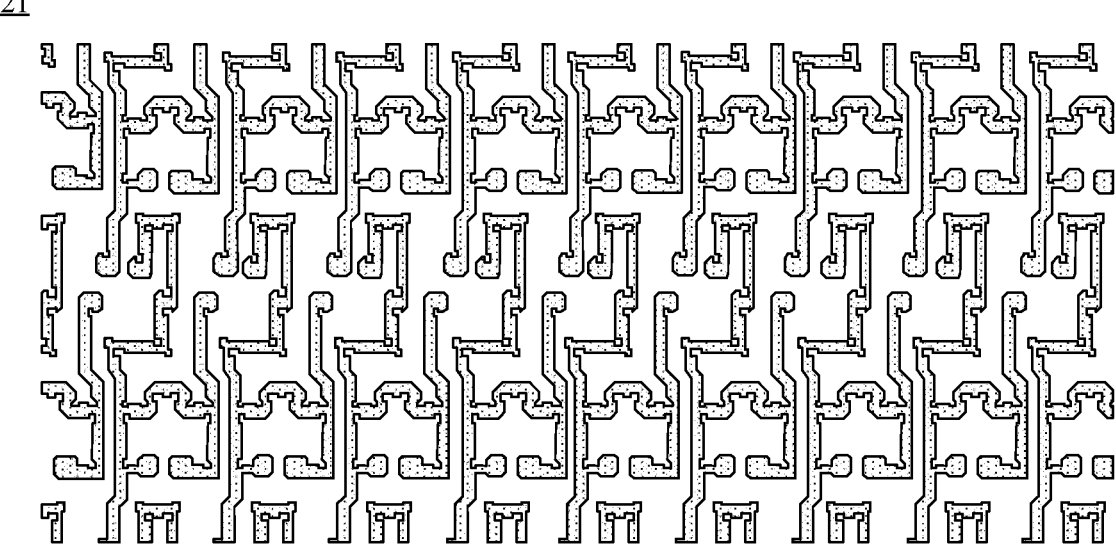
FIG. 9 is a top view of some film layers of a pixel circuit layer, in accordance with some embodiments of the present disclosure.
Figure 10:
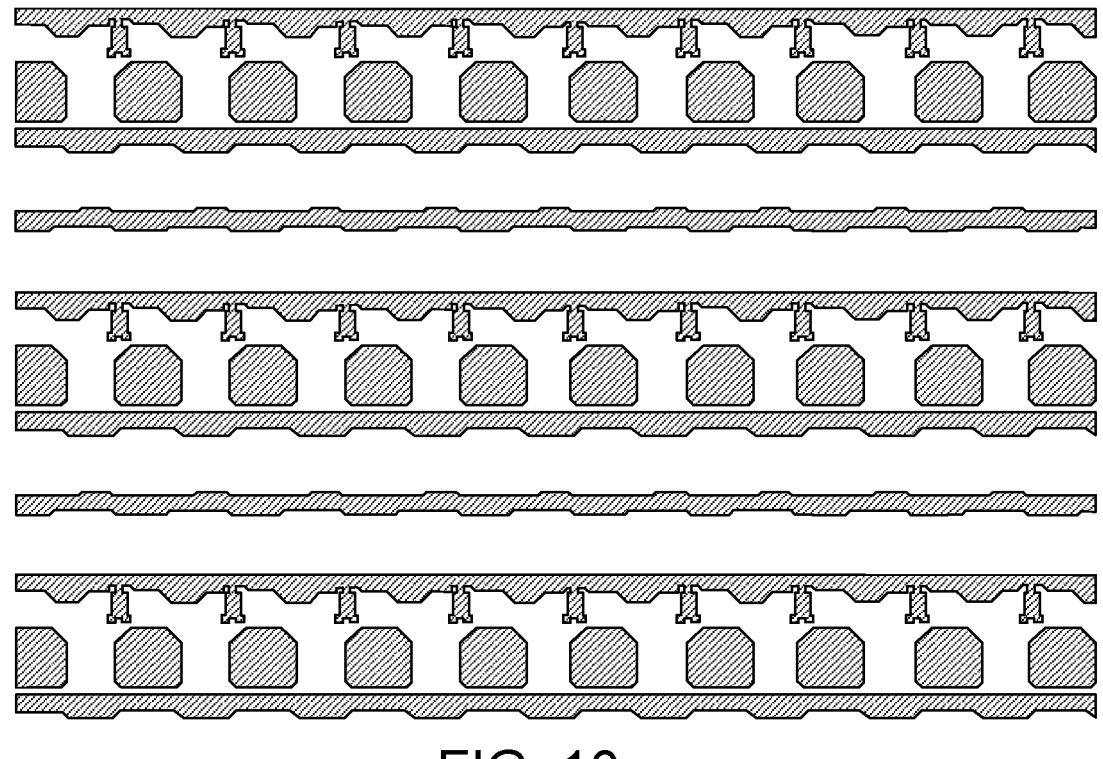
FIG. 10 is a top view of some other film layers of a pixel circuit layer, in accordance with some embodiments of the present disclosure.
Figure 11:
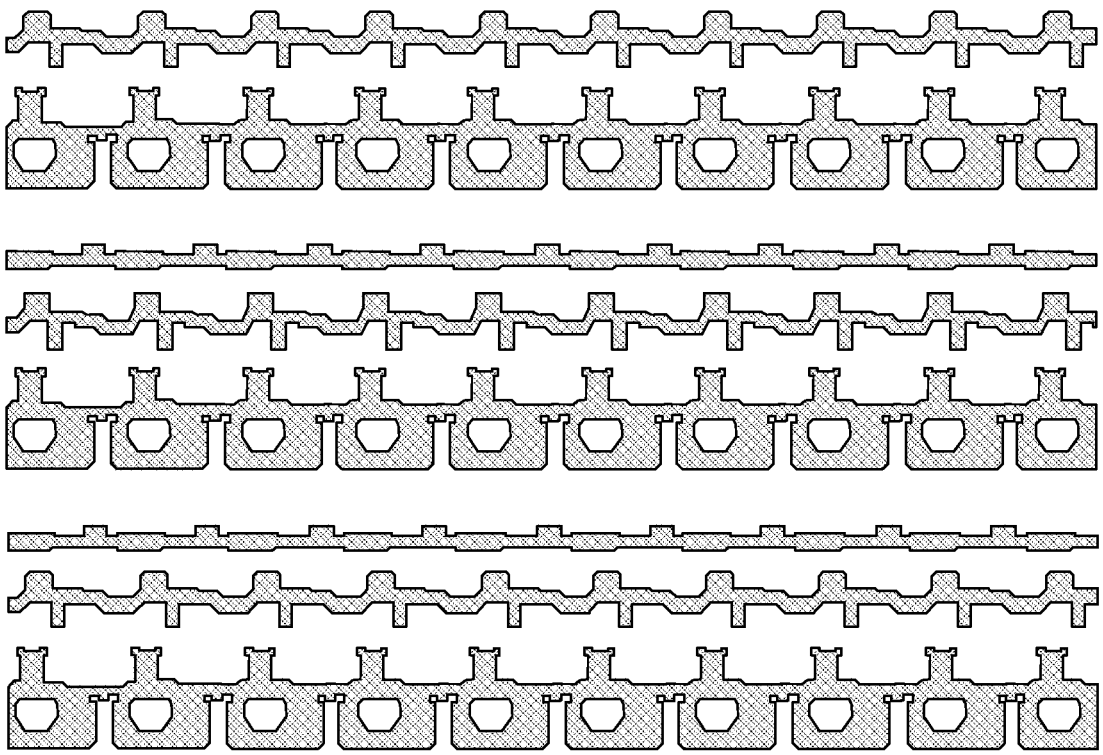
FIG. 11 is a top view of yet some other film layers of a pixel circuit layer, in accordance with some embodiments of the present disclosure.
Figure 12:
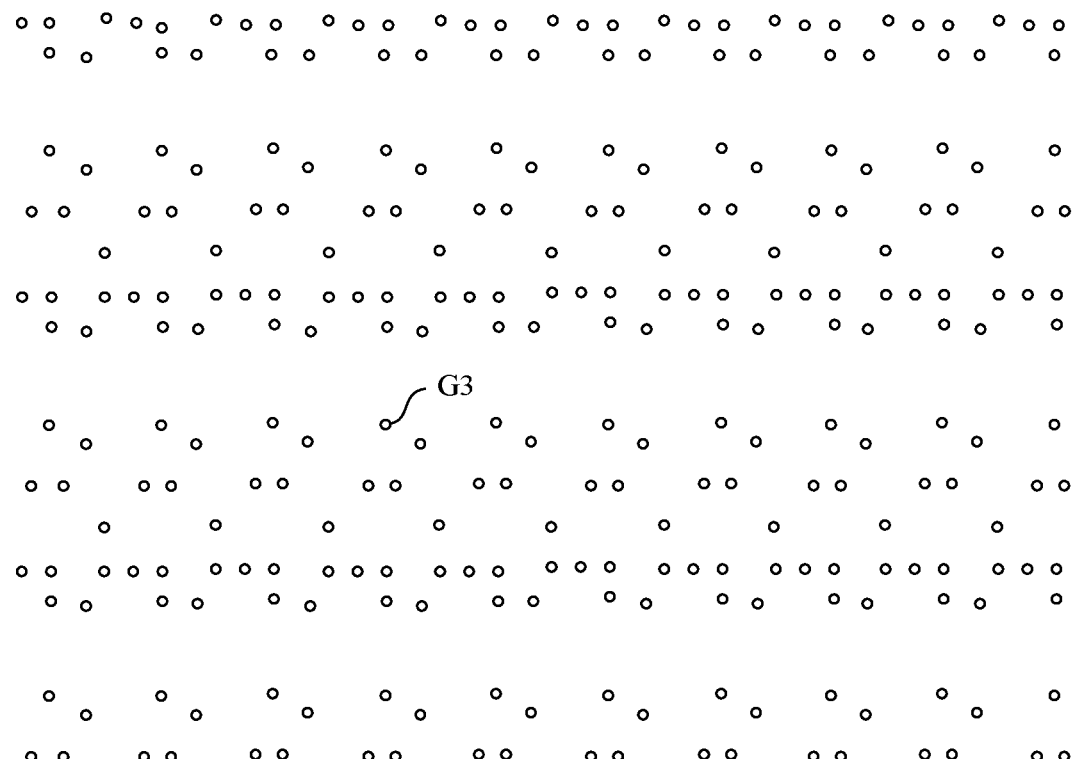
FIG. 12 is a top view of yet some other film layers of a pixel circuit layer, in accordance with some embodiments of the present disclosure.

For example, FIG. 9 shows a top view of a structure of the active layer 21, FIG. 10 shows a top view of a structure of the first gate conductive layer 23, FIG. 11 shows a top view of a structure of the second gate conductive layer 26, FIG. 12 shows a top view of a structure of via holes in the interlayer dielectric layer 223, and FIG. 13 shows a top view of a structure of the source-drain conductive layer 24. It can be understood that the material of the interlayer dielectric layer 223 is a light-transmissive material. Therefore, only positions of the via holes (e.g., including third via holes G3) in the interlayer dielectric layer 223 are schematically shown in FIG. 12.

It should be noted that an orthographic projection of the active layer 21 on the substrate 10 overlaps orthographic projections of the first gate conductive layer 23 and the second gate conductive layer 26 on the substrate 10. After the first gate conductive layer 23 and the second gate conductive layer 26 are formed on the side of the active layer 21 away from the substrate 10, the active layer 21 may be doped by using the first gate conductive layer 23 and the second gate conductive layer 26 as masks, so that portions of the active layer 21 covered by the first gate conductive layer 23 and the second gate conductive layer 26 form active patterns of all transistors in the display pixel circuits C1, and portions of the active layer 21 that are not covered by the first gate conductive layer 23 and the second gate conductive layer 26 form conductors. Portions of the first gate conductive layer 23 or the second gate conductive layer 26 overlapping the active layer 21 forms gates of all the transistors in the display pixel circuits C1.

For example, overlapping portions of the second gate conductive layer 26 and the first gate conductive layer 23 form, for example, storage capacitors in the display pixel circuits C1.

In some examples, as shown in FIGS. 14 and 15, the display substrate 100 further includes a plurality of third via holes G3. Each third via hole G3 of the plurality of third via holes G3 penetrates the multi-layer inorganic insulating layer 22 to a surface of the active layer 21 away from the substrate 10. The plurality of third via holes G3 are located at least in the primary display region A1.

For example, as shown in FIG. 13, the source-drain conductive layer 24 includes a plurality of source-drain conductive patterns. As shown in FIGS. 14 to 16, the plurality of third via holes G3 may expose doped portions of the active layer 21, and portions of the source-drain conductive patterns may be in electrical contact with the doped portions of the active layer 21 through the third via holes G3, so as to form sources and drains of all the transistors in the display pixel circuits C1.

Since the display pixel circuits C1 included in the display substrate 100 are located at least in the primary display region A1, the active layer 21 is located at least in the primary display region A1. For example, the active layer 21 is located in the primary display region A1, or the active layer 21 is located in the primary display region A1 and the secondary display region A2. In addition, the first gate conductive layer 23, the second gate conductive layer 26 and the source-drain conductive layer 24 are located in region(s) substantially the same as region(s) where the active layer 21 is located.

It should be noted that, in the process of forming the active layer included in the pixel circuit layer, the active layer usually contains a large amount of hydrogen, and the hydrogen contained in the active layer will affect characteristics of the transistors (especially the driving transistors) in the subsequent formed pixel circuit layer. Therefore, the active layer generally needs to be dehydrogenated during the process of forming the pixel circuit layer, so as to remove the hydrogen contained in the active layer. For example, before the source-drain conductive layer is formed, the active layer may be heat-treated to cause the hydrogen contained in the active layer to escape.

The escaped hydrogen may, for example, escape through third via holes corresponding to the active layer. In this way, it may be possible to reduce the escaping speed of the hydrogen, avoid the accumulation of high-concentration hydrogen in a short time in the space where the active layer is located, and in turn avoid hydrogen explosion.

In an implementation, during the dehydrogenation process of the active layer, hydrogen contained in a portion of the active layer adjacent to the secondary display region may escape through third via holes directly opposite to the portion or through third via holes adjacent to the portion and away from the secondary display region; and hydrogen contained in portions of the active layer located in other regions may escape through third via holes adjacent to the portions and proximate to the secondary display region.

That is to say, the escaping paths of the hydrogen contained in the portion of the active layer adjacent to the secondary display region is less than that of the hydrogen contained in other portions of the active layer, which results a difference between the dehydrogenation amount of the portion of the active layer adjacent to the secondary display region and the dehydrogenation amount of other portions of the active layer. Therefore, threshold voltages of transistors of some display pixel circuits C1, adjacent to the secondary display region, of the subsequently formed display pixel circuits C1 have forward drift (refers to positive bias), and a range of the positive bias of the threshold voltages of these transistors is, for example, from 0.1 V to 1.2 V.

As shown in Table 1, L64 indicates that the brightness of the light-emitting device is 64 gray scale, L128 indicates that the brightness of the light-emitting device is 128 gray scale, and L255 indicates that the brightness of the light-emitting device is 255 gray scale. A driving current variation $\Delta I$ represents a difference value between a driving current, which is transmitted by a display pixel circuit to a corresponding light-emitting device in a case where threshold voltage(s) of transistor(s) of the display pixel circuit are positively biased, and a driving current, which is transmitted by the display pixel circuit to the corresponding light-emitting device in a case where the threshold voltage(s) of the transistor(s) of the display pixel circuit do not drift. A driving current variation percentage indicates a percentage of the driving current variation to the driving current transmitted by the display pixel circuit to the corresponding light-emitting device in a case where the threshold voltage(s) of the transistor(s) of the display pixel circuit do not drift, and may be used to indicate a difference of the driving current transmitted by the display pixel circuit to the corresponding light-emitting device.

Generally, in a case where a difference of the driving current transmitted to light-emitting devices exceeds 2%, the human eyes may perceive change of light-emitting brightness. It can be seen from Table 1 that, under 64 gray scale, when the threshold voltage(s) are positively biased by 0.1 V, the difference in change of the driving current reaches 2.1% (greater than 2%); under 128 gray scale, when the threshold voltage(s) are positively biased by 0.2 V, the difference in change of the driving current reaches 2.5% (greater than 2%); and under 255 gray scales, when the threshold voltage(s) are positively biased by 0.4 V, the difference in change of the driving current reaches 2.3% (greater than 2%). That is to say, after the threshold voltages of the transistor(s) of the display pixel circuit are positively biased by 0.1 V to 1.2 V, the driving current transmitted, to the corresponding light-emitting device, by the display pixel circuit adjacent to the secondary display region will change, and the light-emitting brightness of the light-emitting device is different from the light-emitting brightness of other light-emitting devices, resulting in a dark ring around the secondary display region (as shown in FIG. 15). Moreover, the dark ring can be observed by the human eyes, which affects the display effect of the display substrate and the display device.

TABLE 1

| Gray scale | Threshold voltage drift amount $\Delta V th$ | Driving current variation $\Delta I$ | Driving current variation percentage (%) |
|---|---|---|---|
| L64 | 0.1 V | −0.034 | −2.1% |
| L128 | 0.2 V | −0.203 | −2.5% |
| L255 | 0.4 V | −1.170 | −2.3% |

Based on this, as shown in FIGS. 14 and 15, the display substrate 100 further includes a plurality of first via holes G1. The plurality of first via holes G1 penetrate at least one layer of the multi-layer inorganic insulating layers 22.

In some examples, each first via hole G1 may penetrate the same film layer(s) or different film layer(s).

For example, FIGS. 14 and 15 each show a local structure after the active layer 21 in the pixel circuit layer 20 and the first gate insulating layer 221, the second gate insulating layer 222 and the interlayer dielectric layer 223 in the multi-layer inorganic insulating layer 22 are stacked.

As shown in FIG. 14, a part of the plurality of first via holes G1 penetrates the interlayer dielectric layer 223, and a depth of the part of the first via holes G1 is, for example, equal to a thickness of the interlayer dielectric layer 223; another part of the first via holes G1 penetrates the interlayer dielectric layer 223, the second gate insulating layer 222 and the first gate insulating layer 221, and a depth of the another part of the first via holes G1 is, for example, equal to a sum of thicknesses of the interlayer dielectric layer 223, the second gate insulating layer 222 and the first gate insulating layer 221. As shown in FIG. 15, the plurality of first via holes G1 all penetrate the interlayer dielectric layer 223, the second gate insulating layer 222 and the first gate insulating layer 221.

Orthogonal projections of the plurality of first via holes G1 on the substrate 10 do not overlap with the orthographic projections of the first gate conductive layer 23 and the second gate conductive layer 26 on the substrate 10. That is, each first via hole G1 is staggered with the first gate conductive layer 23 and the second gate conductive layer 26.

In some examples, the plurality of first via holes G1 are located at least in the transition region A22.

For example, the plurality of first via holes G1 may all be located in the transition region A22. Alternatively, a part of the plurality of first via holes G1 are located in the transition region A22, and another part of the plurality of first via holes G1 are located in the element arrangement region A21. Of course, part of the first via holes G1 may also be located in the primary display region A1.

As shown in FIGS. 18 to 21, the present disclosure is schematically described by taking an example in which the plurality of first via holes G1 are located in the secondary display region A2 and at least in the transition region A22.

FIG. 18 is a partial enlarged view of a display substrate 100, and FIG. 19 is a partial enlarged view of the display substrate 100 shown in FIG. 18.

For example, as shown in FIGS. 18 and 19, the plurality of first via holes G1 may all be located in the transition region A22.

FIG. 20 is a partial enlarged view of another display substrate 100, and FIG. 21 is a partial enlarged view of the another display substrate 100 shown in FIG. 20.

For example, as shown in FIGS. 20 and 21, a part of the plurality of first via holes G1 are located in the transition region A22, and another part of the plurality of first via holes G1 are located in the element arrangement region A21.

The first via holes G1 are arranged in at least the transition region A22, that is, the first via holes G1 are arranged at least in a region proximate to the border of the secondary display region A2, so that a difference between a distribution density of via holes (i.e., the third via holes G3) in the primary display region A1 and a distribution density of via holes (i.e., the first via holes G1) in the region proximate to the border of the secondary display region A2 may be reduced. During the dehydrogenation process of the active layer 21 in the pixel circuit layer 20, the hydrogen contained in the portion of the active layer 21 adjacent to the secondary display region A2 may not only escape through the third via holes G3 directly opposite to the portion or the third via holes G3 adjacent to the portion and away from the secondary display region A2, but also escapes through the first via holes G1 located in the secondary display region A2. In this way, the portion of the active layer 21 adjacent to the secondary display region A2 has the similar number of hydrogen escaping paths compared with other portions of the active layer 21, and the dehydrogenation amount of the portion of the active layer 21 adjacent to the secondary display region A2 is increased, which may reduce the difference of the dehydrogenation amount of all portions of the active layer 21, and avoid a positive bias of threshold voltages of transistors of display pixel circuits C1 in the region adjacent to the secondary display region A2. Therefore, driving currents transmitted by display pixel circuits C1 at different positions to corresponding light-emitting devices 31 are substantially equal, and the difference in the driving currents transmitted by the display pixel circuits C1 at different positions to the corresponding light-emitting device 31 is reduced. As a result, brightness of light emitted by the light-emitting devices 31 at different positions is approximately the same, a dark ring phenomenon of display images of the display substrate 100 and the display device 1000 is reduced and even eliminated, and the uniformity of the display images is improved.

Therefore, in the display substrate 100 provided in the embodiments of the present disclosure, by providing the plurality of first via holes G1 and arranging the plurality of first via holes G1 at least in the transition region A22, during the dehydrogenation process of the active layer 21, the hydrogen contained in the portion of the active layer 21 adjacent to the secondary display region A2 can not only escape through the third via holes G3 directly opposite to the portion or the third via holes G3 adjacent to the portion and away from the secondary display region A2, but also escape through the first via holes G1 located in the transition region A22.

This means that, in the present disclosure, the escaping paths of the hydrogen contained in the portion of the active layer 21 adjacent to the secondary display region A2 are increased, and the dehydrogenation amount of the portion of the active layer 21 adjacent to the secondary display region A2 is increased, so that the dehydrogenation amount of the portion of the active layer 21 adjacent to the secondary display region A2 is close to the dehydrogenation amount of other portions of the active layer 21, which may avoid the positive bias of the threshold voltages of the transistors of the display pixel circuits C1 subsequently formed in the region adjacent to the secondary display region A2. In addition, the brightness of the light emitted by the light-emitting devices 31 at different positions is approximately the same, the dark ring phenomenon of the display images of the display substrate 100 and the display device 1000 is reduced and even eliminated, and the uniformity of the display images is improved.

The distribution of the first via holes G1 in the secondary display region A2 is not limited in the present disclosure, which may be determined according to actual needs.

In some embodiments, as shown in FIGS. 22 and 23, the secondary display region A2 includes first unit area regions a and second unit area regions b, and a distance between a first unit area region a and the border of the secondary display region A2 is greater than a distance between a second unit area region b and the border of the secondary display region A2.

It should be noted that, as shown in FIG. 3, from a macro perspective, a shape of the border of the secondary display region A2 is substantially the same as a shape of a border of the element arrangement region A21. As shown in FIGS. 18 to 23, from a micro perspective, at least a part of the border of the secondary display region A2 may be in a broken line shape or a zigzag shape, and the part of the border in a broken line shape or a zigzag shape and the border of the element arrangement region A21 form an irregular region (e.g., a region in a triangle-like shape shown in FIGS. 19 and 21 to 23).

The distance between the first unit area region a and the border of the secondary display region A2 may be understood as a distance between the first unit area region a and the border of the secondary display region A2 in a direction passing through a center of the element arrangement region A21 and pointing to the secondary display region A2. The distance between the second unit area region b and the border of the secondary display region A2 may be understood as a distance between the second unit area region b and the border of the secondary display region A2 in a direction passing through the center of the element arrangement region A21 and pointing to the secondary display region A2.

The specific positions of the first unit area region a and the second unit area region b in the secondary display region A2 are not limited in the present disclosure, which may be determined according to actual needs as long as the distance between the first unit area region a and the border of the secondary display region A2 is greater than the distance between the second unit area region b and the border of the secondary display region A2.

It can be understood that, areas of the first unit area region a and the second unit area region b are of 1, and the first unit area region a and the second unit area region b have the same area units. The unit areas of the first unit area region a and the second unit area region b may be set according to actual needs. For example, the area units of the first unit area region a and the second unit area region b are each square micron ($\mu m^2$).

For example, both the area of the first unit area region a and the area of the second unit area region b are smaller than the area of the secondary display region A2. A border of the first unit area region a and the border of the secondary display region A2 have a distance therebetween. A border of the second unit area region b partially coincides with the border of the secondary display region A2, or the border of the second unit area region b and the border of the secondary display region A2 have a distance therebetween. In this way, it may be possible to ensure that the distance between the first unit area region a and the border of the secondary display region A2 is greater than the distance between the border of the second unit area region b and the border of the secondary display region A2.

For example, as shown in FIG. 22, L represents a line passing through the center of the element arrangement region A21, and an extending direction of L is the direction passing through the center of the element arrangement region A21 and pointing to the border of the secondary display region A2. L passes through one first unit area region a and one second unit area region b. In this case, the distance between the border of the first unit area region a and the border of the secondary display region A2 is Δh1, the distance between the border of the second unit area region b and the secondary display region A2 is Δh2, and Δh1 is greater than Δh2 (Δh1>Δh2).

It should be noted that a distribution density of first via holes G1 mentioned in the present disclosure refers to a ratio of a sum of areas of orthogonal projections, on the substrate 10, of first via holes G1 arranged in a certain region to an area of an orthographic projection, on the substrate 10, of the certain region.

It can be understood that, in a case where diameters of all the first via holes G1 are equal, the number of first via holes G1 arranged in a unit area region of a certain region may reflect a distribution density of the first via holes G1. For example, the smaller the number of the first via holes G1 arranged in the unit area region is, the smaller the distribution density of the first via holes G1 is; and the larger the number of the first via holes G1 arranged in the unit area region is, the larger the distribution density of the via holes G1 is.

In some examples, as shown in FIGS. 22 and 23, a distribution density of first via holes G1 located in the first unit area region a is less than or equal to a distribution density of first via holes G1 located in the second unit area region b. That is, an area proportion of the first via holes G1 located in the first unit area region a is less than or equal to an area proportion of the first via holes G1 located in the second unit area region b.

For example, in a case where diameters of different first via holes G1 are equal, the number of the first via holes G1 located in the first unit area region a is less than or equal to the number of the first via holes G1 located in the second unit area region b.

That is to say, a distribution density of part of the first via holes G1 closest to the secondary display region A2 is the largest. As the distance to the border of the secondary display region A2 increases, the distribution density of the first via holes G1 decreases. The distribution density of the first via holes G1 may decrease linearly or gradually.

It can be understood that the drift of the threshold voltages of the transistors in the display pixel circuits C1 is transitional. That is, as the distance to the border of the secondary display region A2 increases, the threshold voltage drift amount of the transistors in the display pixel circuits C1 gradually decreases. In the present disclosure, by arranging the distribution density of the first via holes G1, the distribution density of the part of the first via holes G1 closest to the secondary display region A2 is the largest. Therefore, during the dehydrogenation process of the active layer 21, most of the hydrogen contained in the portion of the active layer 21 adjacent to the secondary display region A2 may escape through first via holes G1 that are closest to the secondary display region A2 and have the largest distribution density, which is conducive to fully removing the hydrogen contained in the portion of the active layer 21, and in turn effectively reducing threshold voltage drift amount of transistors proximate to the border of the secondary display region A2, and ameliorating the dark ring phenomenon.

In some examples, as shown in FIG. 23, distribution densities of first via holes G1 in at least two first unit area regions a at the same distance from the border of the secondary display region A2 are the same. And/or, distribution densities of first via holes G1 in at least two second unit area regions b at the same distance from the border of the secondary display region A2 are the same.

For example, distribution densities of first via holes G1 in a plurality of first unit area regions a at the same distance from the border of the secondary display region A2 are the same, that is, area ratios of first via holes G1 in different first unit area regions a are the same. Alternatively, distribution densities of first via holes G1 in a plurality of second unit area regions b at the same distance from the border of the secondary display region A2 are the same, that is, area ratios of first via holes G1 in different second unit area regions b are the same. In this way, a distribution density of first via holes G1 in a ring region, with the same distance to the border of the secondary display region A2, of the secondary display region A2 is the same, so that the number of hydrogen escaping paths of the portion of the active layer 21 adjacent to the secondary display region A2 at positions with the same distance to the secondary display region A2 are substantially the same.

For example, the distribution densities of first via holes G1 in the plurality of first unit area regions a at the same distance from the border of the secondary display region A2 are the same, and the distribution densities of first via holes G1 in the plurality of secondary unit area regions b at the same distance from the border of the secondary display region A2 are the same. In this way, a distribution density of first via holes G1 in any ring region, with the same distance to the border of the secondary display region A2, of the secondary display region A2 is the same, and the farther the distance to the border of the secondary display region A2, the smaller the distribution density of first via holes G1 in the ring region. Therefore, the portion of the active layer 21 adjacent to the secondary display region A2 has the same number of hydrogen escaping paths in any region with the same distance to the secondary display region A2.

In this way, amount of escaped hydrogen of a portion of the active layer 21 around the secondary display region A2 may be substantially the same, and the improvement effect of threshold voltages of different transistors around the secondary display region A2 may be substantially the same, which avoids that the non-uniform dark ring phenomenon appears around the secondary display region A2 (for example, in different regions above, below, on the left, and on the right of the secondary display region A2), and in turn improves the uniformity of the display images of the display substrate 100 and the display device 1000.

In some embodiments, as shown in FIGS. 19 and 21, the first via holes G1 located in the secondary display region A2 are evenly distributed.

For example, a distance between any two adjacent first via holes G1 is equal.

Since the first via holes G1 located in the secondary display region A2 are uniformly distributed, the portion of the active layer 21 adjacent to the secondary display region A2 may have the same hydrogen escaping environment, which causes dehydrogenation amount of the active layer 21 at different positions to be approximately the same; in addition, the layout difficulty of the first via holes G1 is reduced, and the difficulty of manufacturing the display substrate 100 is reduced.

In some embodiments, as shown in FIG. 18, the plurality of first via holes G1 are located in the transition region A22.

At least some of the first via holes G1 in the plurality of first via holes G1 are arranged in sequence along a border of the element arrangement region A21 and arranged in a ring.

In this way, the distribution uniformity of the first via holes G1 may be improved, so that hydrogen of a part of the active layer 21 surrounding the secondary display region A2 can escape through the first via holes G1. Therefore, the dehydrogenation amount of the active layer 21 at different positions is approximately the same, the layout difficulty of the first via holes G1 is reduced, and the difficulty of manufacturing the display substrate 100 is reduced.

In some embodiments, as shown in FIGS. 20 to 23, a part of the plurality of first via holes G1 are located in the transition region A22, and another part of the plurality of first via holes G1 are located in the element arrangement region A21.

That is to say, the region where the first via holes G1 are arranged is not limited to the transition region A22 proximate to the secondary display region A2. The part of the first via holes G1 that is located in the element arrangement region A21 is, for example, located in a region proximate to a border of the transition region A22.

By arranging the first via holes G1 in both the transition region A22 and the element arrangement region A21, not only the area of the region used for arranging the first via holes G1 may be increased, but also the number of first via holes G1 that can be arranged may be greatly increased. In this way, the hydrogen contained in the portion of the active layer 21 adjacent to the secondary display region A2 may have more escaping paths, and the hydrogen contained in the portion of the active layer 21 adjacent to the secondary display region A2 may be more fully removed, so as to ensure a good dehydrogenation effect.

In some examples, as shown in FIGS. 20 to 23, in a case where the another part of the plurality of first via holes G1 are located in the element arrangement region A21, a minimum size of a region occupied by the another part of the plurality of first via holes G1 in the element arrangement region A21 is greater than or equal to a size of a pixel circuit C.

The size of the region occupied by the another part of the plurality of first via holes G1 in the element arrangement region A21 refers to, for example, a size of this region in the direction passing through the center of the element arrangement region A21 and pointing to the border of the transition region A22.

The size of the pixel circuit C refers to, for example, a horizontal size, a vertical size or an average size of the pixel circuit C. The size of the pixel circuit C may be determined according to actual needs.

For example, the above-mentioned minimum size may be equal to the size of one pixel circuit C, the size of two pixel circuits C, or the size of four pixel circuits C. For example, the size of one pixel circuit C is about 64 μm.

By arranging the another part of the plurality of first via holes G1 at least in a portion, proximate to the transition region A22, of the element arrangement region A21, the another part of the first via holes G1 may be close to the portion of the active layer 21 adjacent to the secondary display region A2, which is conducive to reducing the moving distance of hydrogen during the dehydrogenation process of the active layer 21, and in turn fully removing hydrogen. Since the minimum size of the region occupied by the another part of the plurality of first via holes G1 in the element arrangement region A21 is greater than or equal to the size of the pixel circuit C, the hydrogen contained in the portion of the active layer 21 adjacent to the secondary display region A2 may have more escaping paths, which is conducive to fully removing the hydrogen, and in turn reducing the threshold voltage drift amount of the transistors of the display pixel circuits C1 proximate to the secondary display region A2 in a great extent, and ameliorating the dark ring phenomenon.

For example, as shown in FIG. 20, sizes, at different positions, of a region occupied by the another part of the plurality of first via holes G1 in the element arrangement region A21 are equal. The region occupied by the another part of the plurality of first via holes G1 in the element arrangement region A21 is in a ring shape.

In some examples, as shown in FIG. 21, the distribution density of the first via holes G1 located in the transition region A22 is the same as the distribution density of the first via holes G1 located in the element arrangement region A21. That is, the area ratio of the first via holes G1 located in the transition region A22 is the same as the area ratio of the first via holes G1 located in the element arrangement region A21.

In a case where diameters of the first via holes G1 located in the transition region A22 is the same as that of the first via holes G1 located in the element arrangement region A21, a distance between two adjacent first via holes G1 located in the transition region A22 is the same as a distance between two adjacent first via holes G1 located in the element arrangement region A21.

In this way, the plurality of first via holes G1 may be uniformly distributed in the secondary display region A2, which is conducive to providing a uniform hydrogen escaping environment for the portion of the active layer 21 adjacent to the secondary display region A2, and making dehydrogenation amount of different portions of the active layer 21 be approximately the same, so that the threshold voltages of the transistors of the display pixel circuits C1 at different positions are substantially the same.

It can be understood that, a positional relationship between the first via holes G1 and the secondary light-emitting devices 31b varies, which may be determined according to actual needs.

In some embodiments, as shown in FIG. 29, an orthogonal projection, on the substrate 10, of the part of the first via holes G1 located in the element arrangement region A21 does not overlap with orthogonal projections, on the substrate 10, of the secondary light-emitting devices 31b.

That is, the part of the first via holes G1 located in the element arrangement region A21 is staggered with the secondary light-emitting devices 31b. In this way, it is conducive to improving the structural stability of the secondary light-emitting devices 31b.

In some other embodiments, orthogonal projections of part of the plurality of first via holes G1 are located within the orthographic projections of the secondary light-emitting devices 31b on the substrate 10. That is, the part of the first via holes G1 are located below the secondary light-emitting devices 31b.

Optionally, no redundant semiconductor pattern 21a is arranged between at least one first via hole G1 of first via holes G1 located below the secondary light-emitting devices 31b and the substrate 10. As for the secondary light-emitting devices 31b, reference may be made to the following description, and details will not be provided here.

In some embodiments, as shown in FIG. 24, in a direction of a line passing through the center of the element arrangement region A21 and connecting to the border of the secondary display region A2, a diameter of a first via hole G1 is negatively correlated with a distance between the first via hole G1 and the border of the secondary display region A2.

That is to say, the diameter of the first via hole G1 closer to the border of the secondary display region A2 is larger, and the diameter of the first via hole G1 farther away from the border of the secondary display region A2 is smaller. In the direction of the line passing through the center of the element arrangement region A21 and connecting to the border of the secondary display region A2, as the distance between the first via hole G1 and the border of the secondary display region A2 increases, the diameter of the first via hole G1 decreases. The diameter of the first via hole G1 may decrease linearly or gradually.

It can be understood that, during the dehydrogenation process of the active layer 21, in the hydrogen escaping from the secondary display region A2, the greater the hydrogen amount at the position closer to the border of the secondary display region A2, and the less the hydrogen amount at the position farther away from the border of the secondary display region A2.

Since the diameter of the first via hole G1 is negatively correlated with the distance between the first via hole G1 and the border of the secondary display region A2, a region where the hydrogen amount is large may correspond to first via hole(s) with a larger diameter, and a region where the hydrogen amount is small may correspond to first via hole(s) with a smaller diameter, which facilitates a sufficient escaping of hydrogen, and in turn realizes a sufficient dehydrogenation effect, and realizes a good effect of improving the threshold voltages of the transistors of the display pixel circuits C1.

In some embodiments, the distribution density of the first via holes G1 is in a range from 1% to 14%.

For example, the above-mentioned distribution density is the ratio of the sum of the areas of the orthogonal projections of the plurality of first via holes G1 on the substrate 10 to the area occupied by the plurality of first via holes G1.

For example, the distribution density of the first via holes G1 may be 1%, 3%, 5%, 8%, 11% or 14%.

In a case where the distribution density of the first via holes G1 is 14%, the first via holes G1 may be arranged in a densest manner. In this case, it may not only ensure the dehydrogenation effect of the portion of the active layer 21 adjacent to the secondary display region A2, but also ensure the structural stability of the interlayer dielectric layer 223.

Optionally, in a case where a distribution density of first via holes G1 located in the first unit area region a is less than or equal to a distribution density of first via holes G1 located in the second unit area region b, as the distance from the border of the secondary display region A2 increases, the distribution density of the first via holes G1 may decrease from 14% to 1%.

For example, the distribution density of the first via holes G1 may decrease in an order of 14%, 12%, 10%, 8%, 6%, 4%, 2%, and 1%.

As another example, the distribution density of the first via holes G1 may decrease in an order of 14%, 12%, 10%, 10%, 6%, 6%, 2%, and 1%.

Optionally, in a case where a distribution density of first via holes G1 located in the transition region A22 is the same as a distribution density of first via holes G1 located in the element arrangement region A21, the distribution density of the first via holes G1 may be 1%, 3%, 5%, 8%, 11% or 14%.

In some embodiments, as shown in FIGS. 14 and 19, the distribution density of the third via holes G3 located in the primary display region A1 is the same as the distribution density of the first via holes G1 located in the secondary display region A2.

It should be noted that, as shown in FIG. 14, since the third via holes G3 may expose doped portions of the active layer 21, in the subsequent process of forming the source-drain conductive layer 24, part of the source-drain conductive patterns in the source-drain conductive layer 24 are in electrical contact with the active layer 21 through the third via holes G3, so as to form the transistors. Therefore, the distribution density of the third via holes G3 in the primary display region A1 is mainly related to the number of the transistors in the pixel circuits C included in the display substrate 100. The more transistors the display substrate 100 includes, the greater the distribution density of the third via holes G3 in the primary display region A1 will be.

Since the distribution density of the third via holes G3 in the primary display region A1 is the same as the distribution density of the first via holes G1 in the transition region A22, the portion of the active layer 21 adjacent to the secondary display region A2 and other portions of the active layer 21 are in a uniform environment. Therefore, the hydrogen contained in the active layer 21 at different positions has a similar number of escaping paths, so as to ensure that the dehydrogenation amount of the active layer 21 at different positions is relatively close. In this way, it may be possible to avoid a large difference between threshold voltages of transistors formed at different positions, so that driving currents transmitted by pixel circuits at different positions to corresponding light-emitting devices are substantially equal, and the dark ring problem, caused by the driving current difference, in the display images of the display substrate 100 is avoided.

In some embodiments, the distribution density of the third via holes G3 located in the primary display region A1 is smaller than the distribution density of the first via holes G1 located in the secondary display region A2.

For example, the distribution density of the first via holes G1 in the transition region A22 may be arranged according to the maximum density achievable in the related process. In this way, it may ensure that the hydrogen contained in the portion of the active layer 21 adjacent to the border of the secondary display region A2 has sufficient escaping paths in the transition region A22, and ensure a good dehydrogenation effect of the portion of the active layer 21 adjacent to the border of the secondary display region A2. As a result, dehydrogenation amount of the active layer 21 at different positions is substantially the same. The large difference between the threshold voltages of the transistors formed at different positions is avoided, so that the driving currents transmitted by the pixel circuits at different positions to the corresponding light-emitting devices are substantially equal, and the dark ring problem, caused by the driving current difference, in the display images of the display substrate 100 is avoided.

For example, the distribution density of the first via holes G1 in the transition region A22 is 14%.

In some embodiments, as shown in FIG. 25, the plurality of pixel circuits C (e.g., the display pixel circuits C1) included in the display substrate 100 are arranged in a plurality of rows and a plurality of columns. In rows and columns of pixel circuits C surrounding the secondary display region A2, two pixel circuits C in each row of pixel circuits C are respectively located on two opposite sides of the secondary display region A2, and are closer to the secondary display region A2 compared to other pixel circuits in each row of pixel circuits C; and two pixel circuits C in each column of pixel circuits C are respectively located on two opposite sides of the secondary display region A2, and are closer to the secondary display region A2 compared to other pixel circuits in each column of pixel circuits C.

It should be noted that the dotted circle in FIG. 26 may be used to represent pixel circuits C, closest to the border of the secondary display region A2, of the rows and columns surrounding the secondary display region A2, or may also be used to represent driving transistors T4 of the pixel circuits C closest to the border of the secondary display region A2.

In some embodiments, as shown in FIG. 24, minimum distances of driving transistors T4 closest to the border of the secondary display region A2 to the secondary display region A2 are the same.

For example, minimum distances of active patterns included in the driving transistors T4 closest to the border of the secondary display region A2 to the secondary display region A2 are the same.

It should be noted that, in a case where the plurality of pixel circuits C include only the display pixel circuits C1, the pixel circuits C closest to the border of the secondary display region A2 refer to display pixel circuits C1. In a case where the plurality of pixel circuits C further include other circuits, the pixel circuits C closest to the border of the secondary display region A2 refer to display pixel circuits C1. The display pixel circuit C1 may generate a driving current through a driving transistor T4 to drive a light-emitting device 31 to emit light. A threshold voltage of the driving transistor T4 is related to the driving current provided to the light-emitting device 31, and the driving current is related to brightness of light emitted by the light-emitting device 31.

It should also be noted that, for the non-uniform brightness of light emitted by different light-emitting devices 31, an external optical compensation (demura) method may generally be adopted to compensate for brightness difference between different light-emitting devices 31. The key step of the demura method is processing brightness data of light emitted by different light-emitting devices 31 by using a demura algorithm. Therefore, compensation data required by different light-emitting devices 31 is generated, so as to compensate for the brightness difference of the light emitted by different light-emitting devices 31, and the unevenness of the display images is ameliorated. That is, in the face of the dark ring problem mentioned above, the demura method may be used to compensate brightness of light emitted by light-emitting devices 31 located near the border of the secondary display region A2, so that the brightness of the light emitted by these light-emitting devices 31 is close to brightness of light emitted by other light-emitting devices 31. As a result, the dark ring phenomenon is eliminated.

In this embodiment, since the minimum distances of the driving transistors T4 closest to the border of the secondary display region A2 to the secondary display region A2 are the same, the minimum distances of the active patterns included in the driving transistors T4 to the secondary display region A2 are substantially the same. Therefore, in the dehydrogenation process of the active patterns of the driving transistors T4, the distribution of first via holes G1 for the active patterns of the driving transistors T4 may be substantially the same, and dehydrogenation amount of the active patterns of the driving transistors T4 are substantially the same. In this way, even if threshold voltages of driving transistor T4 at different positions around the secondary display region A2 drift, drift values are substantially the same. In a case where the demura method is used to ameliorate the dark ring problem of the display images, it may be possible to reduce the difficulty of processing, by the demura algorithm, the brightness data of the light emitted by different light-emitting devices 31, is easy to generate compensation data required for different light-emitting devices 31 accurately, and is conducive to eliminating the dark ring and improving the uniformity of the display images.

In some embodiments, as shown in FIGS. 27 to 29, the pixel circuit layer 20 further includes a plurality of redundant semiconductor patterns 21a located in the secondary display region A2, and the plurality of redundant semiconductor patterns 21a are arranged in the same layer as the active layer 21.

It will be noted that, the "same layer" mentioned herein refers to a layer structure that is formed by performing, using a same mask, a single patterning process on a film layer for forming specific patterns that is formed by a same film forming process. Depending on the specific patterns, the single patterning process may include several exposure, development or etching processes, and the specific patterns in the formed layer structure may be continuous or discontinuous, and these specific patterns may also be at different heights or have different thicknesses.

In this way, the plurality of redundant semiconductor patterns 21a and the active layer 21 may be formed simultaneously in a single patterning process, which is conducive to simplifying the manufacturing process of the display substrate 100.

For example, the plurality of redundant semiconductor patterns 21a are made of the same material as the active layer 21.

In some examples, as shown in FIGS. 28 to 32, the display substrate 100 further includes a plurality of second via holes G2 disposed in the secondary display region A2. Each second via hole G2 penetrates at least one layer of the above-mentioned multi-layer inorganic insulating layers 22.

Optionally, the structure of the second via holes G2 is the same as that of the first via holes G1.

In some examples, as shown in FIGS. 30 and 31, the plurality of second via holes G2 penetrate the interlayer dielectric layer 223, the second gate insulating layer 222 and the first gate insulating layer 221 to surfaces of the redundant semiconductor patterns 21a away from the substrate 10. Second via hole(s) G2 may expose portion(s) of a surface of a redundant semiconductor pattern 21a.

As shown in FIGS. 28 and 29, orthogonal projections of the plurality of second via holes G2 on the substrate 10 are located within orthographic projections of the redundant semiconductor patterns 21a on the substrate 10, respectively.

The orthogonal projections of the plurality of second via holes G2 on the substrate 10 do not overlap with the orthographic projection of the first gate conductive layer 23 on the substrate 10 and the orthographic projection of the second gate conductive layer 26 on the substrate 10. That is, each second via hole G2 is staggered with the first gate conductive layer 23 and the second gate conductive layer 26.

It can be understood that the plurality of second via holes G2 may be located in the transition region A22, or may be located in the element arrangement region A21. The part of the second via holes G2 located in the transition region A22 may be referred to as first via holes G1.

It should be noted that, since the first gate conductive layer 23, the second gate conductive layer 26, and the source-drain conductive layer 24 are basically located the region outside the secondary display region A2, the ortho-graphic projections of the redundant semiconductor patterns 21a on the substrate 10 do not overlap with an orthographic projection, on the substrate 10, of any one of the first gate conductive layer 23, the second gate conductive layer 26 and the source-drain conductive layer 24. The redundant semiconductor pattern 21a is arranged independently, and is not be a portion of a transistor.

For example, as shown in FIG. 29, the secondary light-emitting devices 31b are located on a side of the redundant semiconductor patterns 21a away from the substrate 10, and the secondary light-emitting devices 31b and the redundant semiconductor patterns 21a are insulated from each other. Orthographic projections of at least some of the redundant semiconductor patterns 21a on the substrate 10 are located within orthographic projections of the secondary light-emitting devices 31b on the substrate 10.

That is to say, orthographic projections of all the redundant semiconductor patterns 21a on the substrate 10 are located within the orthographic projections of the secondary light-emitting devices 31b on the substrate 10. Alternatively, orthographic projections of a part of the redundant semiconductor patterns 21a on the substrate 10 are located within the orthographic projections of the secondary light-emitting devices 31b on the substrate 10, and an orthographic projection of another part of the redundant semiconductor patterns 21a on the substrate 10 does not overlap with the orthographic projections of the secondary light-emitting devices 31b on the substrate 10. In this case, a second via hole G2 corresponding to the another part of the redundant semiconductor patterns 21a, which does not overlap with the orthographic projections of the secondary light-emitting devices 31b on the substrate 10, may be referred to as a first via hole G1.

In some examples, as shown in FIG. 25, a distribution density of part of the first via holes G1 proximate to the border of the element arrangement region A21 is greater than or equal to the distribution density of the second via holes G2.

In this way, the hydrogen contained in the portion of the active layer 21 adjacent to the secondary display region A2 may also escape through the second via holes G2 during the dehydrogenation process, so that the hydrogen escaping paths of the portion of the active layer 21 is further increased, which is conducive to increasing the dehydrogenation efficiency. Since the distribution density of the part of the first via holes G1 proximate to the border of the element arrangement region A21 is greater than or equal to the distribution density of the second via holes G2, it may be possible to improve the difference between dehydrogenation amount of a portion of the active layer 21 adjacent to the secondary display region A2 and dehydrogenation amount of other portions of the active layer 21, and is conducive to ameliorating the dark ring phenomenon.

Optionally, in a case where the distribution density of the first via holes G1 located in the first unit area region a is less than or equal to the distribution density of the first via holes G1 located in the second unit area region b, as the distance from the border of the secondary display region A2 increases, the distribution density of the first via holes G1 decreases, and the distribution density of the part of the first via holes G1 proximate to the border of the element arrangement region A21, for example, decreases to or approaches the distribution density of the second via holes G1.

It should be noted that, by providing the redundant semiconductor patterns 21a, the difference in dehydrogenation amount of different portions of the active layer 21 is improved.

In some embodiments, as shown in FIG. 25, the pixel circuit layer 20 further includes a plurality of redundant pixel circuits C2. The plurality of redundant pixel circuits C2 are located in the primary display region A1, and are located between the plurality of display pixel circuits C11 and the secondary display region A2.

For example, the plurality of redundant pixel circuits C2 are electrically insulated from signal lines (e.g., the scanning signal line Gate, the data signal line Data, the enable signal line EM, etc. as mentioned above) and the anodes of the light emitting devices 31. That is, the plurality of redundant pixel circuits C2 are not coupled to the signal lines (e.g., the scanning signal line Gate, the data signal line Data, the enable signal line EM, etc. as mentioned above), and the plurality of redundant pixel circuits C2 are not coupled to the light-emitting devices 31.

In this way, by providing the plurality of redundant pixel circuits C2, the display uniformity of the display pixel circuits C1 can be improved, and the threshold voltage shift of the display pixel circuits C1 is avoided, so that the problem of abnormal display of light-emitting devices 31 coupled to the display pixel circuits C1 proximate to the border of the secondary display region A2 may be solved.

It can be seen from the above that, the dark ring problem in the display images is mainly caused by part of the display pixel circuits C1 adjacent to the border of the secondary display region A2. By providing the redundant pixel circuits C2 between the plurality of display pixel circuits C1 and the secondary display region A2, even if there is a difference between dehydrogenation amount of portions of the active layer 21 corresponding to the plurality of redundant pixel circuits C2 and dehydrogenation amount of portions of the active layer 21 corresponding to the display pixel circuits C1 during the dehydrogenation process of the active layer 21, it may be possible to avoid affecting the light-emitting brightness of the light-emitting devices 31. In addition, the display pixel circuits C1 are farther away from the border of the secondary display region A2, the dehydrogenation amount is sufficient and consistent. Therefore, it may be possible to avoid positive bias of the threshold voltages of the transistors included in the display pixel circuits C1, and in turn reduce the difference between the driving currents provided by the display pixel circuits C1 to the light-emitting devices 31 coupled to the display pixel circuits C1, and avoid the existence of the dark ring in the display images.

It will be noted that, as shown in FIGS. 16 and 32, the pixel circuit layer 20 further includes a planarization layer 25. The planarization layer 25 may fill the first via holes G1 and the second via holes G2 to provide a planer surface and ensure the structural stability of the secondary light-emitting devices 31b.

The foregoing descriptions are merely specific implementation manners of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate, having a primary display region and a secondary display region, wherein the primary display region at least partially surrounds the secondary display region, and the secondary display region includes an element arrangement region and a transition region surrounding the element arrangement region;

the display substrate comprising:

a substrate located at least in the primary display region and the secondary display region;

a pixel circuit layer located on a side of the substrate, wherein the pixel circuit layer includes an active layer and a multi-layer inorganic insulating layer disposed on a side of the active layer away from the substrate; the active layer is located at least in the primary display region, and at least partially surrounds the secondary display region; and the multi-layer inorganic insulating layer is located at least in the primary display region and the secondary display region; and a plurality of first via holes located at least in the transition region, wherein the plurality of first via holes penetrate at least one layer of the multi-layer inorganic insulating layer.

2. The display substrate according to claim 1, wherein the secondary display region includes first unit area regions and second unit area regions; a distance between a first unit area region of the first unit area regions and a border of the secondary display region is greater than a distance between a second unit area region of the second unit area regions and the border of the secondary display region; and a distribution density of first via holes located in the first unit area region is less than or equal to a distribution density of first via holes located in the second unit area region.

3. The display substrate according to claim 2, wherein distribution densities of first via holes in at least two first unit area regions at a same distance from the border of the secondary display region are the same; and/or distribution densities of first via holes in at least two second unit area regions at a same distance from the border of the secondary display region are the same.

4. The display substrate according to claim 1, wherein first via holes of the plurality of first via holes located in the secondary display region are evenly distributed; and/or the plurality of first via holes are located in the transition region, and at least some of the plurality of first via holes are arranged in sequence along a border of the element arrangement region and arranged in a ring.

5. The display substrate according to claim 1, wherein the pixel circuit layer includes a plurality of pixel circuits;

a part of the plurality of first via holes are located in the transition region, and another part of the plurality of first via holes are located in at least a portion of the element arrangement region proximate to the transition region;

a minimum size of a region occupied by a part of first via holes, located in the element arrangement region, of the plurality of first via holes is greater than or equal to a size of a pixel circuit.

6. The display substrate according to claim 5, wherein a distribution density of a part of first via holes, located in the transition region, of the plurality of first via holes is the same as a distribution density of the part of first via holes, located in the element arrangement region, of the plurality of first via holes.

7. The display substrate according to claim 5, further comprising a light-emitting device layer located on a side of the pixel circuit layer away from the substrate, wherein the light-emitting device layer includes a plurality of secondary light-emitting devices located in the secondary display region; and orthogonal projections of the part of first via holes, located in the element arrangement region, of the plurality of first via holes on the substrate do not overlap with orthographic projections of the plurality of secondary light-emitting devices on the substrate.

8. The display substrate according to claim 1, wherein a distribution density of the plurality of first via holes is in a range from 1% to 14%.

9. The display substrate according to claim 1, wherein in a direction of a line passing through a center of the element arrangement region and connecting to a border of the secondary display region, a diameter of a first via hole is negatively correlated with a distance between the first via hole and the border of the secondary display region.

10. The display substrate according to claim 1, wherein the multi-layer inorganic insulating layer includes a first gate insulating layer, a second gate insulating layer and an interlayer dielectric layer that are stacked in sequence in a direction away from the active layer; and at least one of the plurality of first via holes penetrates the interlayer dielectric layer, the second gate insulating layer and the first gate insulating layer.

11. The display substrate according to claim 10, wherein the pixel circuit layer further includes a plurality of redundant semiconductor patterns located in the secondary display region, and the plurality of redundant semiconductor patterns are arranged in the same layer as the active layer;

the display substrate further comprises a plurality of second via holes located in the secondary display region, wherein the plurality of second via holes penetrate at least one layer of the multi-layer inorganic insulating layer;

orthogonal projections of the plurality of second via holes on the substrate are located within orthogonal projections of the plurality of redundant semiconductor patterns on the substrate; and at least one of the plurality of second via holes in the transition region is a first via hole.

12. The display substrate according to claim 11, wherein the plurality of second via holes penetrate the interlayer dielectric layer, the second gate insulating layer and the first gate insulating layer to surfaces of the plurality of redundant semiconductor patterns away from the substrate.

13. The display substrate according to claim 11, further comprising a light-emitting device layer disposed on a side of the pixel circuit layer away from the substrate, wherein the light-emitting device layer includes a plurality of secondary light-emitting devices located in the secondary display region;

wherein orthogonal projections of at least some of the plurality of second via holes on the substrate are located within orthographic projections of the plurality of secondary light-emitting devices on the substrate.

14. The display substrate according to claim 11, wherein a part of the plurality of second via holes are located in the element arrangement region; and a distribution density of part of the plurality of first via holes proximate to a border of the element arrangement region is greater than or equal to a distribution density of second via holes located in the element arrangement region.

15. The display substrate according to claim 1, further comprising a plurality of third via holes located at least in the primary display region, wherein the plurality of third via holes penetrate the multi-layer inorganic insulating layer to a surface of the active layer away from the substrate; and a distribution density of the plurality of third via holes is less than or equal to a distribution density of the plurality of first via holes.

16. The display substrate according to claim 1, wherein the pixel circuit layer includes a plurality of pixel circuits, at least some of the plurality of pixel circuits are located in the primary display region, and the at least some of the plurality of pixel circuits located in the primary display region surround the secondary display region; and the pixel circuits each include a driving transistor, and minimum distances, to the secondary display region, of driving transistors closest to a border of the secondary display region are the same.

17. The display substrate according to claim 1, further comprising a light-emitting device layer located on a side of the pixel circuit layer away from the substrate, wherein the light-emitting device layer includes a plurality of primary light-emitting devices in the primary display region and a plurality of secondary light-emitting devices located in the secondary display region;

the pixel circuit layer includes a plurality of display pixel circuits, and the plurality of display pixel circuits includes a plurality of first display pixel circuits and a plurality of second display pixel circuits;

the plurality of first display pixel circuits are located in the primary display region, and are respectively electrically connected to the plurality of primary light-emitting devices;

the plurality of second display pixel circuits are located in the primary display region, and are respectively electrically connected to the plurality of secondary light-emitting devices through conductive lines.

18. The display substrate according to claim 1, wherein the display substrate has a display region and a bezel region surrounding the display region, and the display region includes the primary display region and the secondary display region;

the display substrate further comprises a light-emitting device layer located on the pixel circuit layer; the light-emitting device layer includes a plurality of primary light-emitting devices located in the primary display region and a plurality of secondary light-emitting devices located in the secondary display region;

the pixel circuit layer includes a plurality of display pixel circuits; the plurality of display pixel circuits includes a plurality of first display pixel circuits and a plurality of second display pixel circuits;

the plurality of first display pixel circuits are located in the primary display region, and are respectively electrically connected to the plurality of primary light-emitting devices; and the plurality of second display pixel circuits are located in the bezel region, and are respectively electrically connected to the plurality of secondary light-emitting devices through conductive lines.

19. The display substrate according to claim 18, wherein the pixel circuit layer further includes a plurality of redundant pixel circuits; and the plurality of redundant pixel circuits are located in the primary display region, and are located between the plurality of display pixel circuits and the secondary display region.

20. A display device, comprising:

the display substrate according to claim 1; and an optical element disposed on a non-light exit side of the display substrate, wherein an orthographic projection of the optical element on the display substrate at least partially overlaps with the element arrangement region of the display substrate.

* * * * *